(12) United States Patent  (10) Patent No.: US 8,345,423 B2
Campbell et al. (45) Date of Patent: Jan. 1, 2013

(54) INTERLEAVED, IMMERSION-COOLING APPARATUSES AND METHODS FOR COOLING ELECTRONIC SUBSYSTEMS

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 12/825,776

(22) Filed: Jun. 29, 2010

(65) Prior Publication Data

US 2011/0315343 A1  Dec. 29, 2011

(51) Int. Cl.
H05K 7/20 (2006.01)

(52) U.S. Cl. .. 361/699; 361/700; 165/80.4; 165/104.33; 257/714; 257/715

(58) Field of Classification Search ........................ None
See application file for complete search history.

(56) References Cited

U.S. PATENT DOCUMENTS

| | | |
|---|---|---|
| 2,125,888 A | 8/1938 | Cordrey |
| 2,512,545 A | 6/1950 | Hazard |
| 2,548,325 A | 4/1951 | Smith |
| 2,643,282 A | 6/1953 | Green |
| 2,791,888 A | 5/1957 | Vani |
| 3,109,485 A | 11/1963 | Fortier |
| 3,143,592 A | 8/1964 | August |
| 3,226,941 A | 1/1966 | Snelling |
| 3,404,730 A | 10/1968 | Kurisu |
| 3,476,175 A | 11/1969 | Plevyak |
| 3,512,582 A | 5/1970 | Chu et al. |

(Continued)

FOREIGN PATENT DOCUMENTS

DE 10112389 A1 10/2002

(Continued)

OTHER PUBLICATIONS

Notice of Allowance for U.S. Appl. No. 12/256,618 (U.S. Publication No. 2010/0101759 A1), dated Feb. 10, 2011.

(Continued)

*Primary Examiner* — Boris Chervinsky
(74) *Attorney, Agent, or Firm* — Dennis Jung, Esq.; Kevin P. Radigan, Esq.; Heslin Rothenberg Farley & Mesiti P.C.

(57) ABSTRACT

Cooling apparatuses and methods are provided for immersion-cooling of an electronic subsystem of an electronics rack. The cooling apparatuses include a housing at least partially surrounding and forming a sealed compartment about the electronic subsystem and a dielectric fluid disposed within the sealed compartment, with the electronic subsystem being immersed within the dielectric fluid. A liquid-cooled vapor condenser is provided which includes a plurality of thermally conductive condenser fins extending within the sealed compartment. The condenser fins facilitate cooling and condensing of dielectric fluid vapor generated within the sealed compartment. Within the sealed compartment, multiple thermally conductive condenser fins are interleaved with multiple fluid-boiling fins of a heat spreader coupled to one or more of the electronic components immersed within the dielectric fluid. The interleaved fins facilitate localized cooling and condensing of dielectric fluid vapor within the sealed compartment.

25 Claims, 17 Drawing Sheets

U.S. PATENT DOCUMENTS

| | | | |
|---|---|---|---|
| 3,578,014 A | 5/1971 | Gachot | |
| 3,586,101 A | 6/1971 | Chu et al. | |
| 3,600,636 A | 8/1971 | Petersen | |
| 3,609,991 A | 10/1971 | Chu et al. | |
| 3,774,677 A | 11/1973 | Antonetti et al. | |
| 3,858,909 A | 1/1975 | Friedman | |
| 4,064,300 A | 12/1977 | Bhangu | |
| 4,108,242 A | 8/1978 | Searight et al. | |
| 4,201,195 A | 5/1980 | Sakhuja | |
| 4,302,793 A | 11/1981 | Rohner | |
| 4,430,866 A | 2/1984 | Willitts | |
| 4,590,538 A | 5/1986 | Cray, Jr. | |
| 4,619,316 A | 10/1986 | Nakayama et al. | |
| 4,622,946 A | 11/1986 | Hurley et al. | |
| 4,649,990 A * | 3/1987 | Kurihara et al. | 165/80.4 |
| 4,694,378 A | 9/1987 | Nakayama et al. | |
| 4,704,658 A | 11/1987 | Yokouchi et al. | |
| 4,741,385 A | 5/1988 | Bergles et al. | |
| 4,750,086 A | 6/1988 | Mittal | |
| 4,912,600 A | 3/1990 | Jaeger et al. | |
| 4,928,206 A | 5/1990 | Porter et al. | |
| 4,928,207 A | 5/1990 | Chrysler et al. | |
| 4,962,444 A | 10/1990 | Niggemann | |
| 5,021,924 A | 6/1991 | Kieda et al. | |
| 5,057,968 A | 10/1991 | Morrison | |
| 5,063,476 A | 11/1991 | Hamadah et al. | |
| 5,067,047 A | 11/1991 | Azar | |
| 5,126,919 A | 6/1992 | Yamamoto et al. | |
| 5,168,348 A | 12/1992 | Chu et al. | |
| 5,183,104 A | 2/1993 | Novotny | |
| 5,220,804 A | 6/1993 | Tilton et al. | |
| 5,270,572 A | 12/1993 | Nakajima et al. | |
| 5,274,530 A | 12/1993 | Anderson | |
| 5,297,621 A * | 3/1994 | Taraci et al. | 165/104.13 |
| 5,305,184 A | 4/1994 | Anderesen et al. | |
| 5,349,831 A | 9/1994 | Daikiku et al. | |
| 5,390,077 A * | 2/1995 | Paterson | 361/700 |
| 5,406,807 A | 4/1995 | Ashlwake et al. | |
| 5,414,592 A | 5/1995 | Stout et al. | |
| 5,458,185 A | 10/1995 | Mizuno | |
| 5,467,250 A | 11/1995 | Howard et al. | |
| 5,491,363 A | 2/1996 | Yoshikawa | |
| 5,675,473 A | 10/1997 | McDunn et al. | |
| 5,687,577 A | 11/1997 | Ballard et al. | |
| 5,718,117 A | 2/1998 | McDunn et al. | |
| 5,780,928 A * | 7/1998 | Rostoker et al. | 257/713 |
| 5,785,101 A | 7/1998 | Dennis | |
| 5,825,621 A | 10/1998 | Giannatto et al. | |
| 5,829,264 A | 11/1998 | Ishigaki et al. | |
| 5,854,092 A | 12/1998 | Root et al. | |
| 5,860,602 A | 1/1999 | Tilton et al. | |
| 5,864,466 A | 1/1999 | Remsburg | |
| 5,880,931 A | 3/1999 | Tilton et al. | |
| 5,907,473 A | 5/1999 | Przilas et al. | |
| 5,943,211 A | 8/1999 | Havey et al. | |
| 5,959,351 A | 9/1999 | Sasaki et al. | |
| 5,963,425 A | 10/1999 | Chrysler et al. | |
| 5,970,731 A | 10/1999 | Hare et al. | |
| 6,000,908 A | 12/1999 | Bunker | |
| 6,016,969 A | 1/2000 | Tilton et al. | |
| 6,019,167 A | 2/2000 | Bishop et al. | |
| 6,026,565 A | 2/2000 | Giannatto et al. | |
| 6,052,284 A | 4/2000 | Suga et al. | |
| 6,055,157 A | 4/2000 | Bartilson | |
| 6,139,361 A | 10/2000 | Przilas et al. | |
| 6,173,577 B1 | 1/2001 | Gold | |
| 6,193,905 B1 | 2/2001 | Yamada et al. | |
| 6,205,799 B1 | 3/2001 | Patel et al. | |
| 6,212,895 B1 | 4/2001 | Richardson | |
| 6,243,268 B1 | 6/2001 | Kang et al. | |
| 6,320,744 B1 | 11/2001 | Sullivan et al. | |
| 6,349,554 B2 | 2/2002 | Patel et al. | |
| 6,366,462 B1 | 4/2002 | Chu et al. | |
| 6,378,605 B1 | 4/2002 | Kutcher et al. | |
| 6,392,891 B1 | 5/2002 | Tzlil et al. | |
| 6,393,853 B1 | 5/2002 | Vukovic et al. | |
| 6,404,640 B1 | 6/2002 | Ishimine et al. | |
| 6,431,260 B1 | 8/2002 | Agonafer et al. | |
| 6,457,321 B1 | 10/2002 | Patel et al. | |
| 6,462,941 B1 | 10/2002 | Hulick et al. | |
| 6,519,151 B2 | 2/2003 | Chu et al. | |
| 6,536,510 B2 | 3/2003 | Khrustalev et al. | |
| 6,571,569 B1 | 6/2003 | Rini et al. | |
| 6,574,104 B2 | 6/2003 | Patel et al. | |
| 6,581,388 B2 | 6/2003 | Novotny et al. | |
| 6,616,469 B2 | 9/2003 | Goodwin et al. | |
| 6,621,707 B2 | 9/2003 | Ishimine et al. | |
| 6,644,058 B2 | 11/2003 | Bash et al. | |
| 6,646,879 B2 | 11/2003 | Pautsch | |
| 6,708,515 B2 | 3/2004 | Malone et al. | |
| 6,807,056 B2 | 10/2004 | Kondo et al. | |
| 6,817,196 B2 | 11/2004 | Malone et al. | |
| 6,828,675 B2 | 12/2004 | Memory et al. | |
| 6,927,980 B2 | 8/2005 | Fukuda et al. | |
| 6,953,227 B2 * | 10/2005 | Dunn et al. | 361/699 |
| 6,955,062 B2 | 10/2005 | Tilton et al. | |
| 6,973,801 B1 | 12/2005 | Campbell et al. | |
| 6,976,528 B1 | 12/2005 | Tilton et al. | |
| 7,011,143 B2 | 3/2006 | Corrado et al. | |
| 7,012,807 B2 | 3/2006 | Chu et al. | |
| 7,057,893 B2 | 6/2006 | Nicolai et al. | |
| 7,079,393 B2 | 7/2006 | Colgan et al. | |
| 7,088,585 B2 | 8/2006 | Chu et al. | |
| 7,104,078 B2 | 9/2006 | Tilton | |
| 7,106,590 B2 | 9/2006 | Chu et al. | |
| 7,134,289 B2 | 11/2006 | Patel et al. | |
| 7,143,605 B2 | 12/2006 | Rohrer et al. | |
| 7,187,549 B2 | 3/2007 | Teneketges | |
| 7,191,954 B2 | 3/2007 | Kline | |
| 7,222,502 B2 | 5/2007 | Kobayashi et al. | |
| 7,233,491 B2 | 6/2007 | Faneuf et al. | |
| 7,251,139 B2 | 7/2007 | Bhattacharya et al. | |
| 7,252,100 B1 | 8/2007 | Downes et al. | |
| 7,258,161 B2 | 8/2007 | Cosley et al. | |
| 7,272,005 B2 | 9/2007 | Campbell et al. | |
| 7,285,851 B1 | 10/2007 | Cepeda-Rizo et al. | |
| 7,286,356 B2 | 10/2007 | Keenan et al. | |
| 7,295,436 B2 | 11/2007 | Cheon | |
| 7,295,440 B2 | 11/2007 | Ganev et al. | |
| 7,309,209 B2 | 12/2007 | Amiot et al. | |
| 7,349,213 B2 | 3/2008 | Campbell et al. | |
| 7,355,852 B2 | 4/2008 | Pfahnl | |
| 7,362,574 B2 | 4/2008 | Campbell et al. | |
| 7,365,973 B2 | 4/2008 | Rasmussen et al. | |
| 7,372,698 B1 | 5/2008 | Tilton et al. | |
| 7,375,962 B2 | 5/2008 | Campbell et al. | |
| 7,380,409 B2 | 6/2008 | Campbell et al. | |
| 7,385,810 B2 | 6/2008 | Chu et al. | |
| 7,392,660 B2 | 7/2008 | Tilton et al. | |
| 7,392,823 B2 | 7/2008 | Dong et al. | |
| 7,400,505 B2 | 7/2008 | Campbell et al. | |
| 7,403,392 B2 | 7/2008 | Attlesey et al. | |
| 7,408,776 B2 | 8/2008 | Campbell et al. | |
| 7,414,845 B2 | 8/2008 | Attlesey et al. | |
| 7,420,808 B2 | 9/2008 | Campbell et al. | |
| 7,428,151 B2 | 9/2008 | Sonnabend et al. | |
| 7,436,666 B1 | 10/2008 | Konshak | |
| 7,450,384 B2 | 11/2008 | Tavassoli et al. | |
| 7,450,385 B1 | 11/2008 | Campbell et al. | |
| 7,466,549 B2 | 12/2008 | Dorrich et al. | |
| 7,477,513 B1 | 1/2009 | Cader et al. | |
| 7,477,514 B2 | 1/2009 | Campbell et al. | |
| 7,495,914 B2 | 2/2009 | Tilton et al. | |
| 7,531,142 B2 | 5/2009 | Huziwara et al. | |
| 7,559,207 B2 | 7/2009 | Knight et al. | |
| 7,561,425 B2 * | 7/2009 | Mindock et al. | 361/700 |
| 7,602,608 B2 | 10/2009 | Tilton et al. | |
| 7,609,518 B2 | 10/2009 | Hopton et al. | |
| 7,630,795 B2 | 12/2009 | Campbell et al. | |
| 7,639,499 B1 | 12/2009 | Campbell et al. | |
| 7,641,101 B2 | 1/2010 | Campbell et al. | |
| 7,654,100 B2 | 2/2010 | Rini et al. | |
| 7,660,109 B2 | 2/2010 | Iyengar et al. | |
| 7,661,463 B2 | 2/2010 | Liu | |
| 7,724,524 B1 | 5/2010 | Campbell et al. | |
| 7,885,070 B2 | 2/2011 | Campbell et al. | |
| 7,916,483 B2 | 3/2011 | Campbell et al. | |

| | | | |
|---|---|---|---|
| 7,944,694 | B2 | 5/2011 | Campbell et al. |
| 7,957,145 | B2* | 6/2011 | Suzuki et al. .................. 361/701 |
| 7,961,475 | B2 | 6/2011 | Campbell et al. |
| 7,983,040 | B2 | 7/2011 | Campbell et al. |
| 8,014,150 | B2 | 9/2011 | Campbell et al. |
| 8,077,462 | B2 | 12/2011 | Barringer et al. |
| 8,179,677 | B2 | 5/2012 | Campbell et al. |
| 8,184,436 | B2 | 5/2012 | Campbell et al. |
| 2002/0062945 | A1 | 5/2002 | Hocker et al. |
| 2003/0230401 | A1 | 12/2003 | Pfister et al. |
| 2004/0008490 | A1 | 1/2004 | Cheon |
| 2004/0057211 | A1 | 3/2004 | Kondo et al. |
| 2005/0083655 | A1* | 4/2005 | Jairazbhoy et al. ........... 361/699 |
| 2005/0207116 | A1 | 9/2005 | Yatskov et al. |
| 2005/0241802 | A1 | 11/2005 | Malone et al. |
| 2005/0244280 | A1 | 11/2005 | Malone et al. |
| 2005/0254214 | A1 | 11/2005 | Salmon |
| 2006/0026983 | A1 | 2/2006 | Tilton et al. |
| 2006/0126296 | A1 | 6/2006 | Campbell et al. |
| 2006/0162365 | A1 | 7/2006 | Hoang et al. |
| 2006/0180300 | A1 | 8/2006 | Lenehan et al. |
| 2007/0025081 | A1 | 2/2007 | Berlin et al. |
| 2007/0035937 | A1 | 2/2007 | Colbert et al. |
| 2007/0121295 | A1 | 5/2007 | Campbell et al. |
| 2007/0159797 | A1 | 7/2007 | Teneketges |
| 2007/0183125 | A1 | 8/2007 | Tilton et al. |
| 2007/0193300 | A1 | 8/2007 | Tilton et al. |
| 2007/0199204 | A1 | 8/2007 | Knight et al. |
| 2007/0199340 | A1 | 8/2007 | Knight et al. |
| 2007/0201210 | A1 | 8/2007 | Chow et al. |
| 2007/0227710 | A1 | 10/2007 | Belady et al. |
| 2007/0291452 | A1 | 12/2007 | Gilliland et al. |
| 2007/0295480 | A1 | 12/2007 | Campbell et al. |
| 2007/0297136 | A1 | 12/2007 | Konshak |
| 2008/0002363 | A1 | 1/2008 | Campbell et al. |
| 2008/0018212 | A1 | 1/2008 | Spearing et al. |
| 2008/0024991 | A1 | 1/2008 | Colbert et al. |
| 2008/0062639 | A1 | 3/2008 | Campbell et al. |
| 2008/0123297 | A1 | 5/2008 | Tilton et al. |
| 2008/0158818 | A1 | 7/2008 | Clidaras et al. |
| 2008/0196868 | A1 | 8/2008 | Attlesey et al. |
| 2008/0209931 | A1 | 9/2008 | Stevens |
| 2008/0225478 | A1 | 9/2008 | Goettert et al. |
| 2009/0080173 | A1 | 3/2009 | Schmidt et al. |
| 2009/0086428 | A1 | 4/2009 | Campbell et al. |
| 2009/0086432 | A1 | 4/2009 | Campbell et al. |
| 2009/0126810 | A1 | 5/2009 | Campbell et al. |
| 2009/0126909 | A1 | 5/2009 | Ellsworth, Jr. et al. |
| 2009/0133866 | A1 | 5/2009 | Campbell et al. |
| 2009/0238235 | A1 | 9/2009 | Campbell et al. |
| 2009/0260777 | A1 | 10/2009 | Attlesey |
| 2009/0268404 | A1 | 10/2009 | Chu et al. |
| 2009/0314467 | A1 | 12/2009 | Campbell et al. |
| 2009/0316360 | A1 | 12/2009 | Campbell et al. |
| 2010/0101759 | A1 | 4/2010 | Campbell et al. |
| 2010/0101765 | A1 | 4/2010 | Campbell et al. |
| 2010/0103614 | A1 | 4/2010 | Campbell et al. |
| 2010/0103618 | A1 | 4/2010 | Campbell et al. |
| 2010/0103620 | A1 | 4/2010 | Campbell et al. |
| 2010/0246118 | A1 | 9/2010 | Attlesey |
| 2010/0326628 | A1 | 12/2010 | Campbell et al. |

FOREIGN PATENT DOCUMENTS

| | | |
|---|---|---|
| JP | 8-254512 A | 10/1996 |
| JP | 2002-374086 | 12/2002 |
| WO | 2009131810 | 10/2009 |

OTHER PUBLICATIONS

RD 323064 A, Mar. 10, 1991.

Office Action for U.S. Appl. No. 12/256,631 (U.S. Patent Publication No. 2010-0103614 A1 ), dated Apr. 21, 2010.

Office Action for U.S. Appl. No. 12/256,628 (U.S. Patent Publication No. 2010-0103618 A1 ), dated Aug. 5, 2010.

Office Action for U.S. Appl. No. 12/256,605 (U.S. Patent Publication No. 2010/0103620 A1), dated Aug. 10, 2010.

Campbell et al., "Liquid-Cooled Electronics Rack with Immersion-Cooled Electronic Subsystems and Vertically-Mounted, Vapor-Condensing Unit", U.S. Appl. No. 12/825,745, filed Jun. 29, 2010.

Campbell et al., "Immersion-Cooling Apparatus and Method for an Electronic Subsystem of an Electronics Rack", U.S. Appl. No. 12/825,756, filed Jun. 29, 2010.

Campbell et al., "Interleaved, Immersion-Cooling Apparatus and Method for an Electronic Subsystem of an Electronics Rack", U.S. Appl. No. 12/825,761, filed Jun. 29, 2010.

Campbell et al., "Liquid-Cooled Electronics Rack with Immersion-Cooled Electronic Subsystems", U.S. Appl. No. 12/825,781, filed Jun. 29, 2010.

Office Action for U.S. Appl. No. 12/256,618 (U.S. Patent Publication No. 2010/0101759 A1), dated Aug. 30, 2010.

Campbell et al., Office Action for U.S. Appl. No. 12/825,745, filed Jun. 29, 2010 (U.S. Patent Publication No. 2011/0315353 A1), dated May 14, 2012.

Hwang, U., "Heat Exchanger for Vapor Condensation by Dropwise Technique", IBM Technical Disclosure Bulletin, Publication No. IPCOM000089717D (Dec. 1, 1977).

Chu et al.,"Dielectric Fluidized Cooling System", IBM Technical Disclosure Bulletin, Publication No. IPCOM000088682D (Jul. 1, 1977).

Oktay et al., "Subcooled Flow Boiling with Flow Pattern Control", IBM Technical Disclosure Bulletin, Publication No. IPCOM000067827D (Oct. 1, 1979).

Hwang et al., "Evaporation Cooling Module", IBM Technical Disclosure Bulletin, Publication No. IPCOM000066472D (Mar. 1, 1979).

Campbell et al., "Suspended Integrated Manifold System with Serviceability for large Planar Arrays of Electronic Modules", IBM Technical Disclosure, Publication No. IPCOM000126455D (Jul. 18, 2005).

International Application No. PCT/EP2009/060792, filed Aug. 20, 2009. Notification of International Search Report, dated Dec. 23, 2009.

Chee, B., "Supermicro Water Cooled Blades", Info World, Geeks in Paradise, (Mar. 5, 2008), http://weblog.infoworld.com/geeks/archives/2008/03.

D. Delia et al., "System Cooling Design for the Water-Cooled IBM Enterprise System/900 Processors", IBM Journal of Research and Development, vol. 36, No. 4 pp. 791-803 (Jul. 1992).

Miyahara, M., "Small Fans for Cooling Small Electronic Devices", Electronics Cooling Magazine, online article retrieved from http://electronics-cooling.com/html/2009_may_techbrief.php (Aug. 31, 2009).

Nelson et al., "Thermal Performance of an Integral Immersion Cooled Multi-Chip Module Package", IEEE Transactions on Components, Packaging and Manufacturing Technology, Part A, vol. 17, No. 3 (Sep. 1994).

Zamanabadi et al., "Hybrid Control Challenges in Refrigeration Systems", Danfoss A/A, Denmark, Advanced Engineering—Refrigeration and Air Conditioning, EECI (2007).

Campbell et al., "Condenser Fin Structures Facilitating Vapor Condensation Cooling of Coolant", U.S. Appl. No. 12/491,286, filed Jun. 25, 2009.

Campbell et al., "Condenser Structures with Fin Cavities Facilitating Vapor Condensation Cooling of Coolant", U.S. Appl. No. 12/491,287, filed Jun. 25, 2009.

Campbell et al., "Apparatus and Method for Adjusting Coolant Flow Resistance Through Liquid-Cooled Electronics Rack(s)", U.S. Appl. No. 12/556,040, filed Sep. 9, 2009.

Campbell et al., "Apparatus and Method with Forced Coolant Vapor Movement for Facilitating Two-Phase Cooling of an Electric Device", U.S. Appl. No. 12/565,175, filed Sep. 23, 2009.

Campbell et al., "Liquid-Cooled Electronics Apparatus and Methods of Fabrication", U.S. Appl. No. 12/556,081, filed Sep. 24, 2009.

Campbell et al., "Compliant Conduction Rail Assembly and Method Facilitating Cooling of an Electronics Structure", U.S. Appl. No. 12/570,215, filed Sep. 30, 2009.

Campbell et al., "Cooled Electronic Module with Pump-Enhanced, Dielectric Fluid Immersion-Cooling", U.S. Appl. No. 12/491,281, filed Jun. 25, 2009.

Campbell et al., "System and Method for Standby Mode Cooling of a Liquid-Cooled Electronics Rack", U.S. Appl. No. 12/567,954, filed Sep. 28, 2009.

Campbell et al., "Cooling System and Method Minimizing Power Consumption in Cooling Liquid-Cooled Electronics Racks", U.S. Appl. No. 12/556,066, filed Sep. 9, 2009.

Campbell et al., Notice of Allowance for U.S. Appl. No. 12/825,756, filed Jun. 29, 2010 (U.S. Patent Publication No. 2011/0315355 A1), dated Jan. 13, 2012.

Campbell et al., Notice of Allowance for U.S. Appl. No. 12/825,781, filed Jun. 29, 2010 (U.S. Patent Publication No. 2011/0317367 A1), dated Jan. 20, 2012.

Campbell et al., Notice of Allowance for U.S. Appl. No. 12/985,552, filed Jan. 6, 2011 (U.S. Patent Publication No. 2011/0103019 A1), dated Feb. 16, 2012.

Office Action for U.S. Appl. No. 12/256,623 (U.S. Patent Publication No. 2010/0101765 A1), dated Nov. 5, 2010.

* cited by examiner

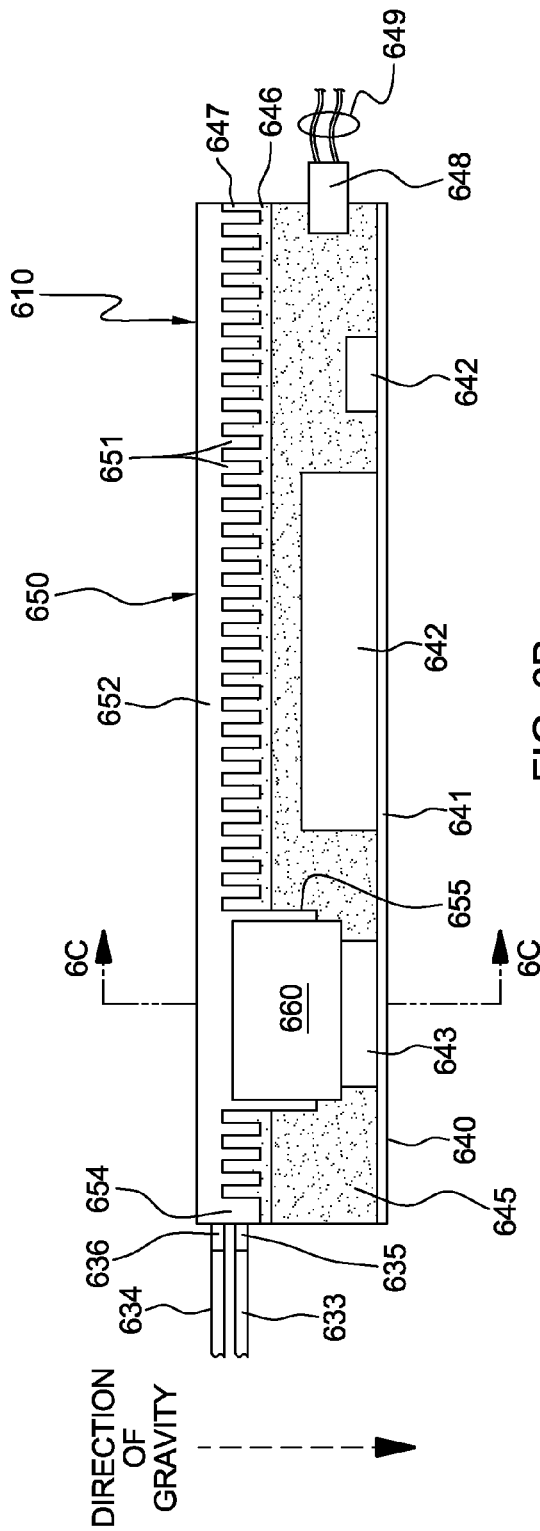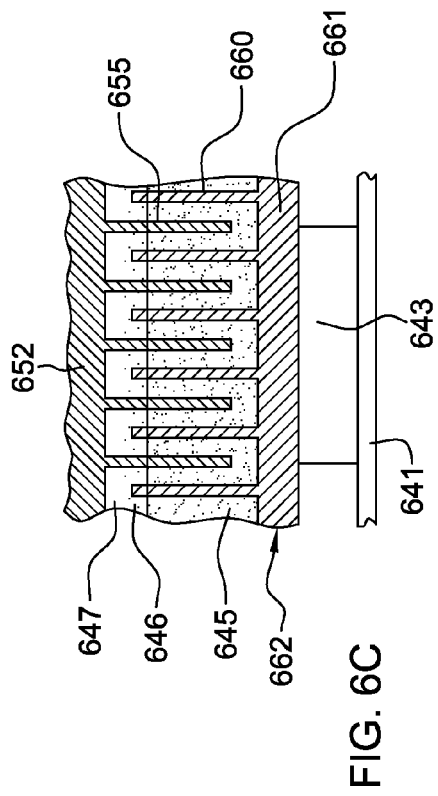

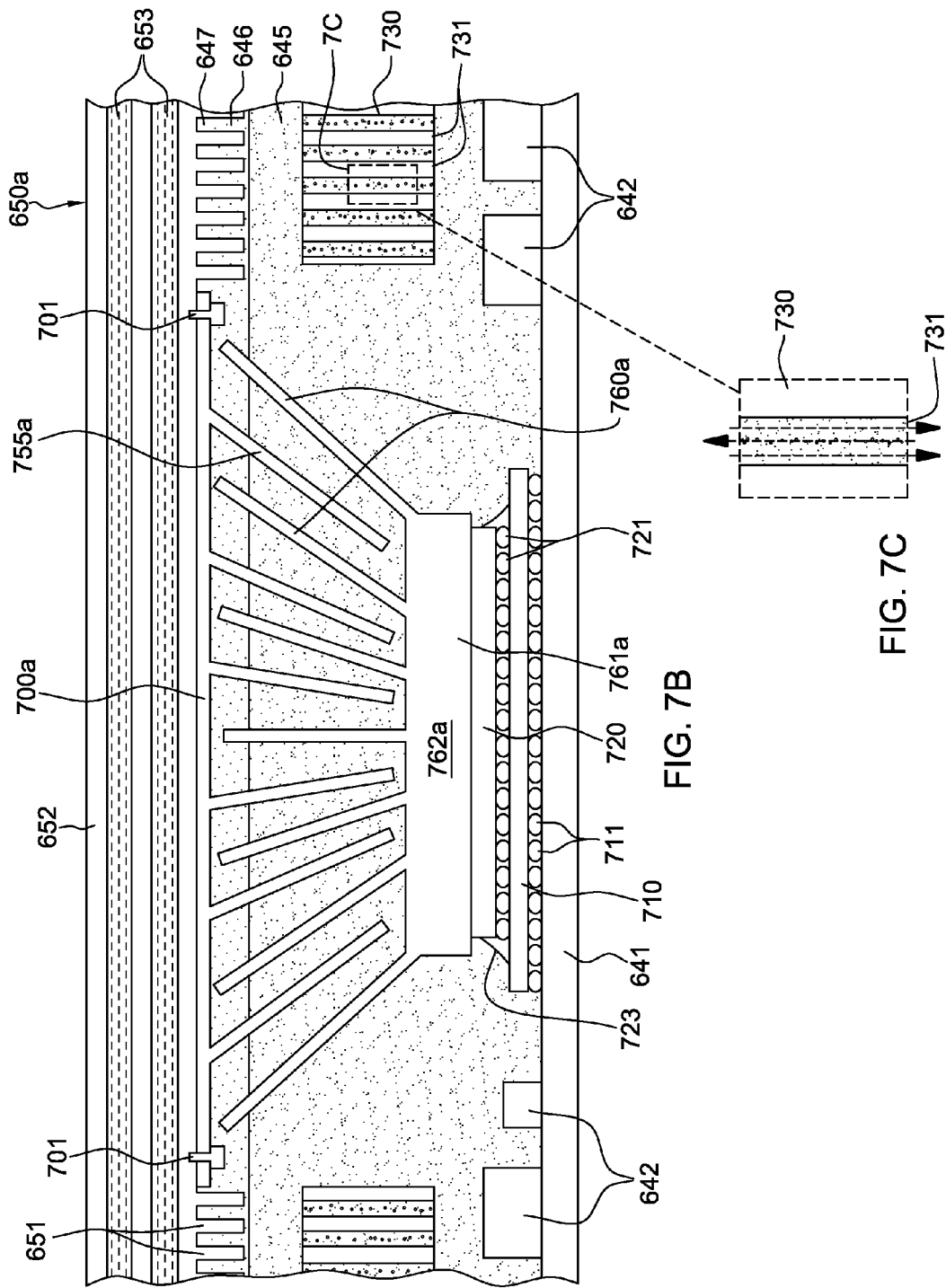

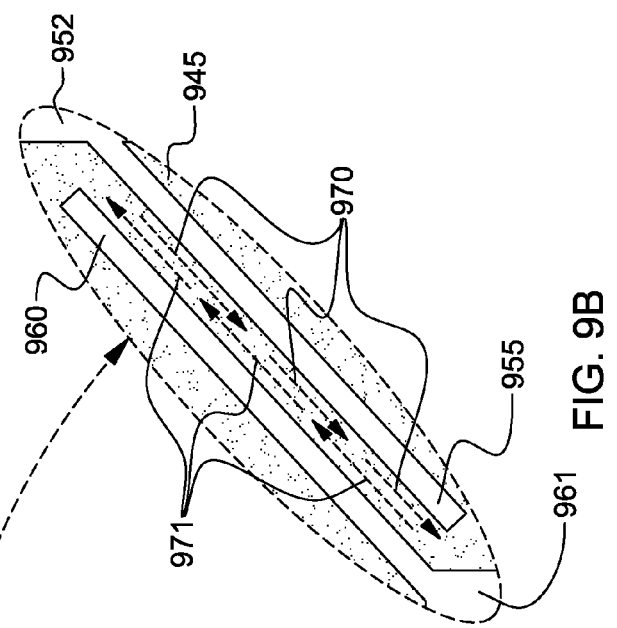
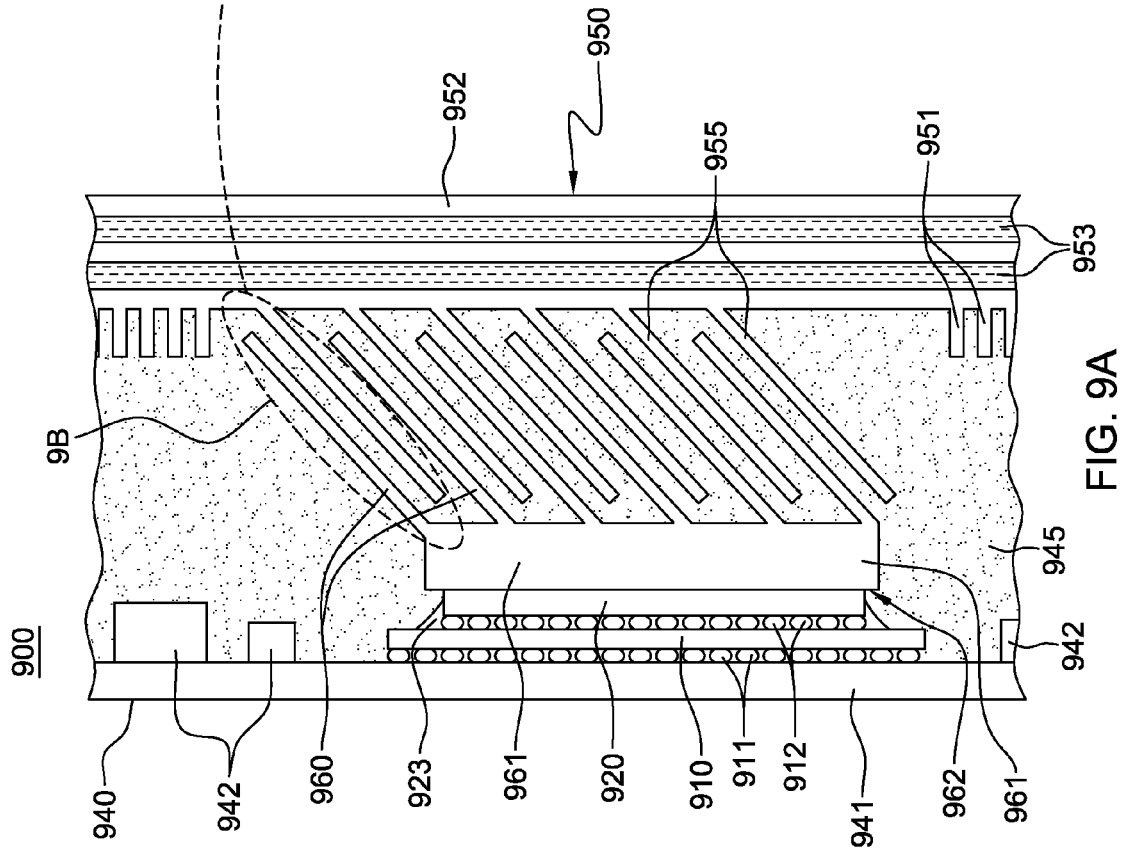
FIG. 9B
FIG. 9A

INTERLEAVED, IMMERSION-COOLING APPARATUSES AND METHODS FOR COOLING ELECTRONIC SUBSYSTEMS

BACKGROUND

The present invention relates in general to apparatuses and methods for facilitating cooling of rack-mounted assemblages of individual electronic units, such as rack-mounted computer server units.

The power dissipation of integrated circuit chips, and the modules containing the chips, continues to increase in order to achieve increases in processor performance. This trend poses cooling challenges at the module, subsystem and system levels.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer or subsystem by providing greater airflow, for example, through the use of a more powerful air moving device or by increasing the rotational speed (i.e., RPMs) of an existing air moving device. However, this approach is becoming problematic, particularly in the context of a computer center installation (i.e., data center).

The sensible heat load carried by the air exiting the rack is stressing the availability of the room air-conditioning to effectively handle the load. This is especially true for large installations with "server farms" or large banks of computer racks close together. In such installations, liquid-cooling is an attractive technology to manage the higher heat fluxes. The liquid absorbs the heat dissipated by the components/modules in an efficient manner. Typically, the heat is ultimately transferred from the liquid to an outside environment, whether air or other liquid-coolant.

BRIEF SUMMARY

The shortcomings of the prior art are overcome and additional advantages are provided through the provision of a cooling apparatus comprising a housing configured to at least partially surround and form a sealed compartment about an electronic subsystem comprising a plurality of electronic components to be cooled. A dielectric fluid is disposed within the sealed compartment and the electronic subsystem's plurality of electronic components to be cooled are immersed within the dielectric fluid. The cooling apparatus further includes a heat spreader and a liquid-cooled vapor condenser. The heat spreader is coupled to at least one electronic component of the plurality of electronic components to be cooled, and includes multiple fluid-boiling fins extending therefrom within the sealed compartment. The liquid-cooled vapor condenser includes a plurality of thermally conductive condenser fins extending within the sealed compartment, which facilitate cooling and condensing of dielectric fluid vapor within the sealed compartment. Multiple thermally conductive condenser fins of the plurality of thermally conductive condenser fins are interleaved within the sealed compartment with multiple fluid-boiling fins of a heat spreader coupled to at least one electronic component of the plurality of electronic components immersed within the dielectric fluid. This interleaved fin structure facilitates localized cooling and condensing of dielectric fluid vapor in the region between the fluid-boiling and condenser fins.

In another aspect, a liquid-cooled electronics rack is provided. The liquid-cooled electronics rack includes: an electronics rack, comprising an electronic subsystem including a plurality of electronic components to be cooled, and a cooling apparatus for immersion-cooling of the plurality of electronic components of the electronic subsystem. The cooling apparatus includes a housing at least partially surrounding and forming a sealed compartment about the electronic subsystem comprising the plurality of electronic components, and a dielectric fluid disposed within the sealed compartment, wherein the electronic subsystem's plurality of electronic components are immersed within the dielectric fluid. The cooling apparatus further includes a heat spreader and a liquid-cooled vapor condenser. The heat spreader is coupled to at least one electronic component of the plurality of electronic components to be cooled, and includes multiple fluid-boiling fins extending therefrom within the sealed compartment. The liquid-cooled vapor condenser includes a plurality of thermally conductive condenser fins extending within the sealed compartment, which facilitate cooling and condensing of dielectric fluid within the sealed compartment. Multiple thermally conductive condenser fins of the plurality of thermally conductive condenser fins are interleaved within the sealed compartment with multiple fluid-boiling fins of a heat spreader coupled to at least one electronic component of the plurality of electronic components immersed within the dielectric fluid. This interleaved fin structure facilitates localized cooling and condensing of dielectric fluid vapor in the region between the fluid-boiling and condenser fins.

In a further aspect, a method of facilitating cooling of an electronic subsystem is provided. The method includes: providing a housing at least partially surrounding and forming a sealed compartment about the electronic subsystem, the electronic subsystem including a plurality of electronic components to be cooled, at least one electronic component of the plurality of electronic components having a thermal spreader coupled thereto, the thermal spreader comprising multiple fluid-boiling fins extending within the sealed compartment; immersing the electronic subsystem's plurality of electronic components within the dielectric fluid within the sealed compartment; providing a liquid-cooled vapor condenser comprising a plurality of thermally conductive condenser fins extending within the sealed compartment, the plurality of thermally conductive condenser fins facilitating cooling and condensing of dielectric fluid vapor within the sealed compartment, wherein the providing includes interleaving multiple thermally conductive condenser fins of the plurality of thermally conductive condenser fins with the multiple fluid-boiling fins of the heat spreader coupled to the at least one electronic component of the plurality of electronic components immersed within the dielectric fluid within the sealed compartment.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 6B is a cross-sectional elevational view of one immersion-cooled electronic subsystem of the liquid-cooled electronics rack of FIG. 6A, in accordance with an aspect of the present invention;

FIG. 6C is a partial cross-sectional elevational view of the immersion-cooled electronic subsystem of FIG. 6B, taken along line 6C-6C thereof, in accordance with an aspect of the present invention;

FIG. 7B depicts the immersion-cooled electronic subsystem of FIG. 7A, shown with a porous filler material within the sealed compartment, in accordance with an aspect of the present invention;

FIG. 7C is a partially enlarged view of the porous filler material depicted in the immersion-cooled electronic subsystem of FIG. 7B, in accordance with an aspect of the present invention;

FIG. 9A is a partial cross-sectional elevational view of one embodiment of a vertically-oriented, immersion-cooled electronic subsystem, in accordance with an aspect of the present invention;

FIG. 9B is a partial enlargement of the interleaved, liquid-cooled vapor condenser and heat spreader structure of FIG. 9A, in accordance with an aspect of the present invention;

DETAILED DESCRIPTION

Figure 1:
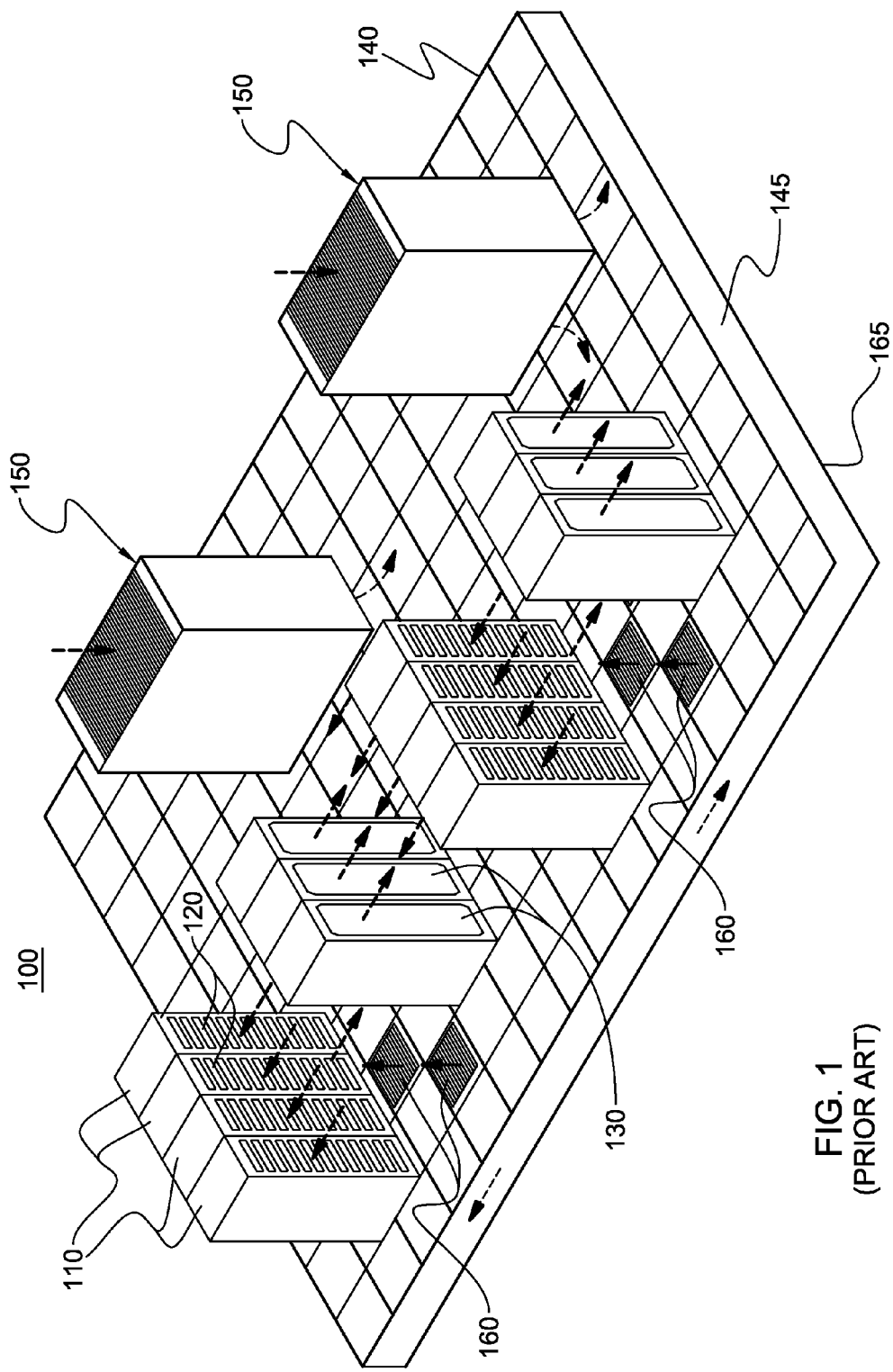
FIG. 1 depicts one embodiment of a conventional raised floor layout of an air-cooled computer installation.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronic system, and may be, for example, a stand alone computer processor having high, mid or low end processing capability. In one embodiment, an electronics rack may comprise one or more electronic subsystems, each having one or more heat generating components disposed therein requiring cooling. "Electronic subsystem" refers to any housing, blade, book, drawer, node, compartment, board, etc., having multiple heat generating electronic components disposed therein or thereon. Each electronic subsystem of an electronics rack may be movable or fixed relative to the electronics rack, with the rack-mounted electronic drawers of a rack unit and blades of a blade center system being two examples of subsystems of an electronics rack to be cooled. In one embodiment, electronic subsystem refers to an electronic system which comprises multiple different types of electronic components, and may be, in one example, a server unit.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. Further, unless otherwise specified herein, the terms "liquid-cooled cold plate" and "liquid-cooled base plate" each refer to any conventional thermally conductive structure having a plurality of channels or passageways formed therein for flowing of liquid-coolant therethrough.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or refrigerant, while still maintaining the advantages and unique features of the present invention.

Reference is made below to the drawings (which are not drawn to scale for ease of understanding), wherein the same reference numbers used throughout different figures designate the same or similar components.

As shown in FIG. 1, in a raised floor layout of an air-cooled computer installation 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the computer installation 100. Room air is taken into each air conditioning unit 150 near an upper portion thereof. This room air comprises in part exhausted air from the "hot" aisles of the computer installation defined by opposing air outlet sides 130 of the electronics racks 110.

Figure 2:
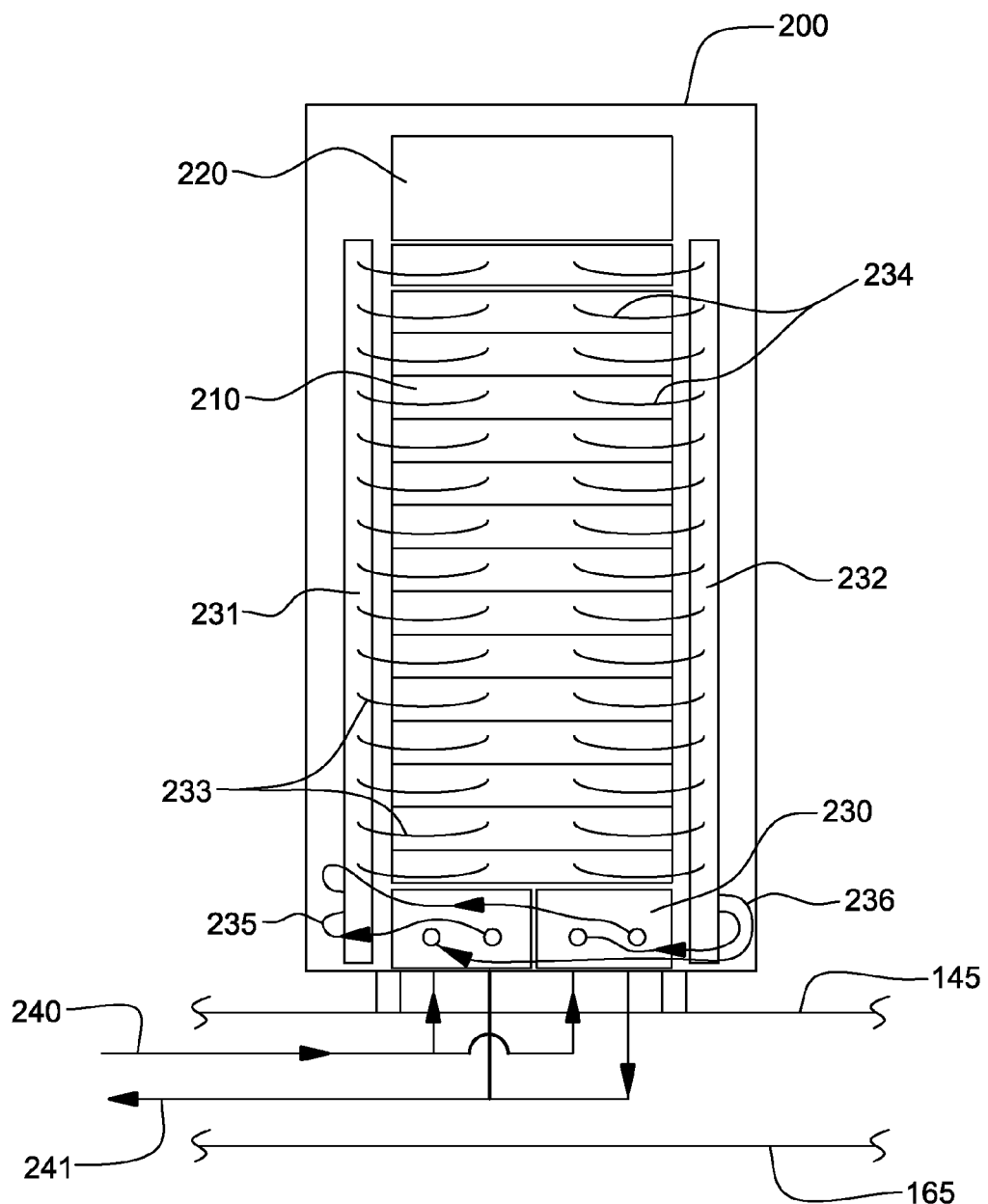
FIG. 2 is a front elevational view of one embodiment of a liquid-cooled electronics rack comprising multiple electronic subsystems to be cooled via a cooling apparatus, in accordance with an aspect of the present invention.

FIG. 2 depicts one embodiment of a liquid-cooled electronics rack 200, which may comprise a cooling apparatus such as described herein below. In one embodiment, liquid-cooled electronics rack 200 comprises a plurality of electronic subsystems 210, which may be processor or server nodes (in one embodiment). A bulk power assembly 220 is disposed at an upper portion of liquid-cooled electronics rack 200, and two modular cooling units (MCUs) 230 are positioned in a lower portion of the liquid-cooled electronics rack for providing system coolant to the electronic subsystems. In the embodiments described herein, the system coolant is assumed to be water or an aqueous-based solution, by way of example only.

In addition to MCUs 230, the cooling apparatus includes a system coolant supply manifold 231, a system coolant return manifold 232, and manifold-to-node fluid connect hoses 233 coupling system coolant supply manifold 231 to electronic subsystems 210 (for example, to cold plates or liquid-cooled vapor condensers (not shown) disposed within the subsystems) and node-to-manifold fluid connect hoses 234 coupling the individual electronic subsystems 210 to system coolant return manifold 232. Each MCU 230 is in fluid communication with system coolant supply manifold 231 via a respective system coolant supply hose 235, and each MCU 230 is in fluid communication with system coolant return manifold 232 via a respective system coolant return hose 236.

Heat load of the electronic subsystems is transferred from the system coolant to cooler facility coolant within the MCUs 230 provided via facility coolant supply line 240 and facility coolant return line 241 disposed, in the illustrated embodiment, in the space between raised floor 145 and base floor 165.

Figure 3:
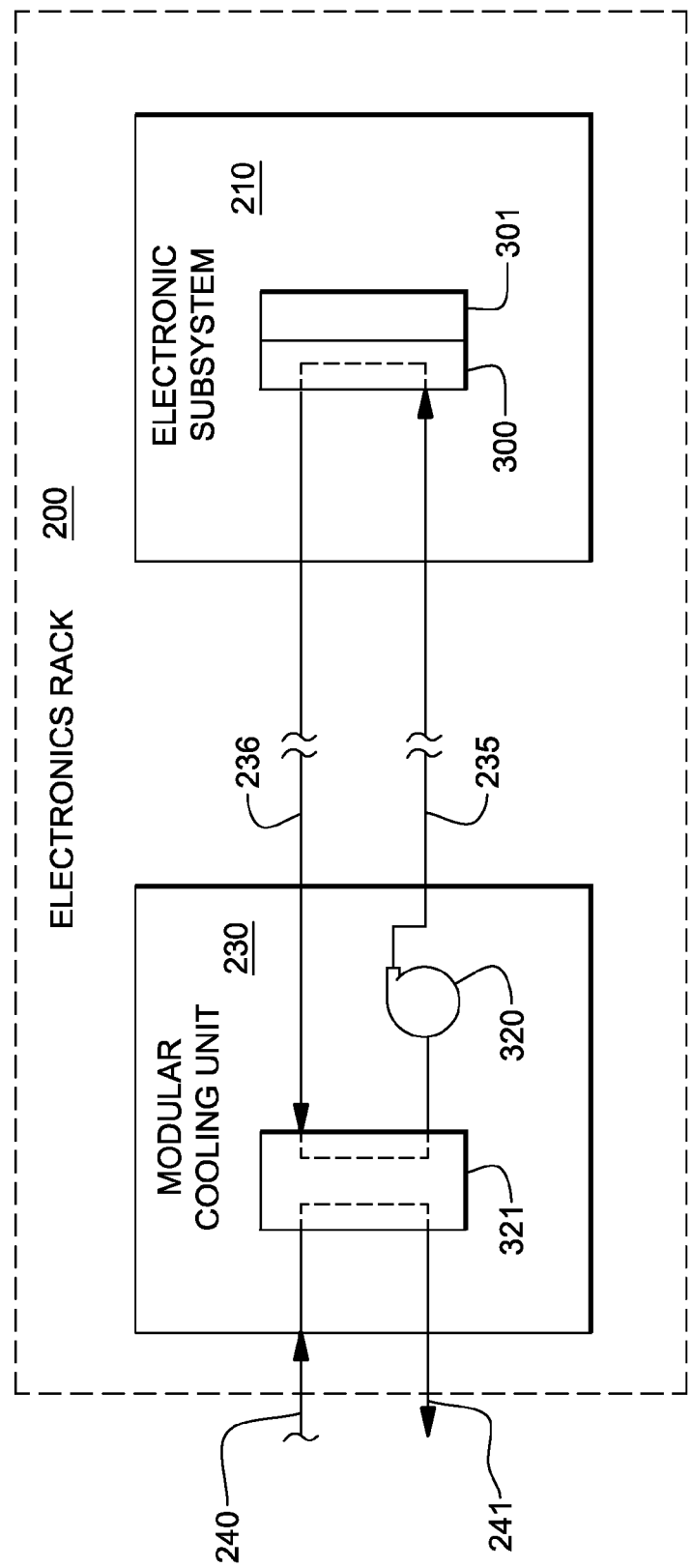
FIG. 3 is a schematic of an electronic subsystem of an electronics rack and one approach to liquid-cooling of an electronic component with the electronic subsystem, wherein the electronic component is indirectly liquid-cooled by system coolant provided by one or more modular cooling units disposed within the electronics rack, in accordance with an aspect of the present invention.

FIG. 3 schematically illustrates one cooling approach using the cooling apparatus of FIG. 2, wherein a liquid-cooled cold plate 300 is shown coupled to an electronic component 301 of an electronic subsystem 210 within the liquid-cooled electronics rack 200. Heat is removed from electronic component 301 via system coolant circulating via pump 320 through liquid-cooled cold plate 300 within the system coolant loop defined, in part, by liquid-to-liquid heat exchanger 321 of modular cooling unit 230, hoses 235, 236 and cold plate 300. The system coolant loop and modular cooling unit are designed to provide coolant of a controlled temperature and pressure, as well as controlled chemistry and cleanliness to the electronic subsystems. Furthermore, the system coolant is physically separate from the less controlled facility coolant in lines 240, 241, to which heat is ultimately transferred.

Figure 4:
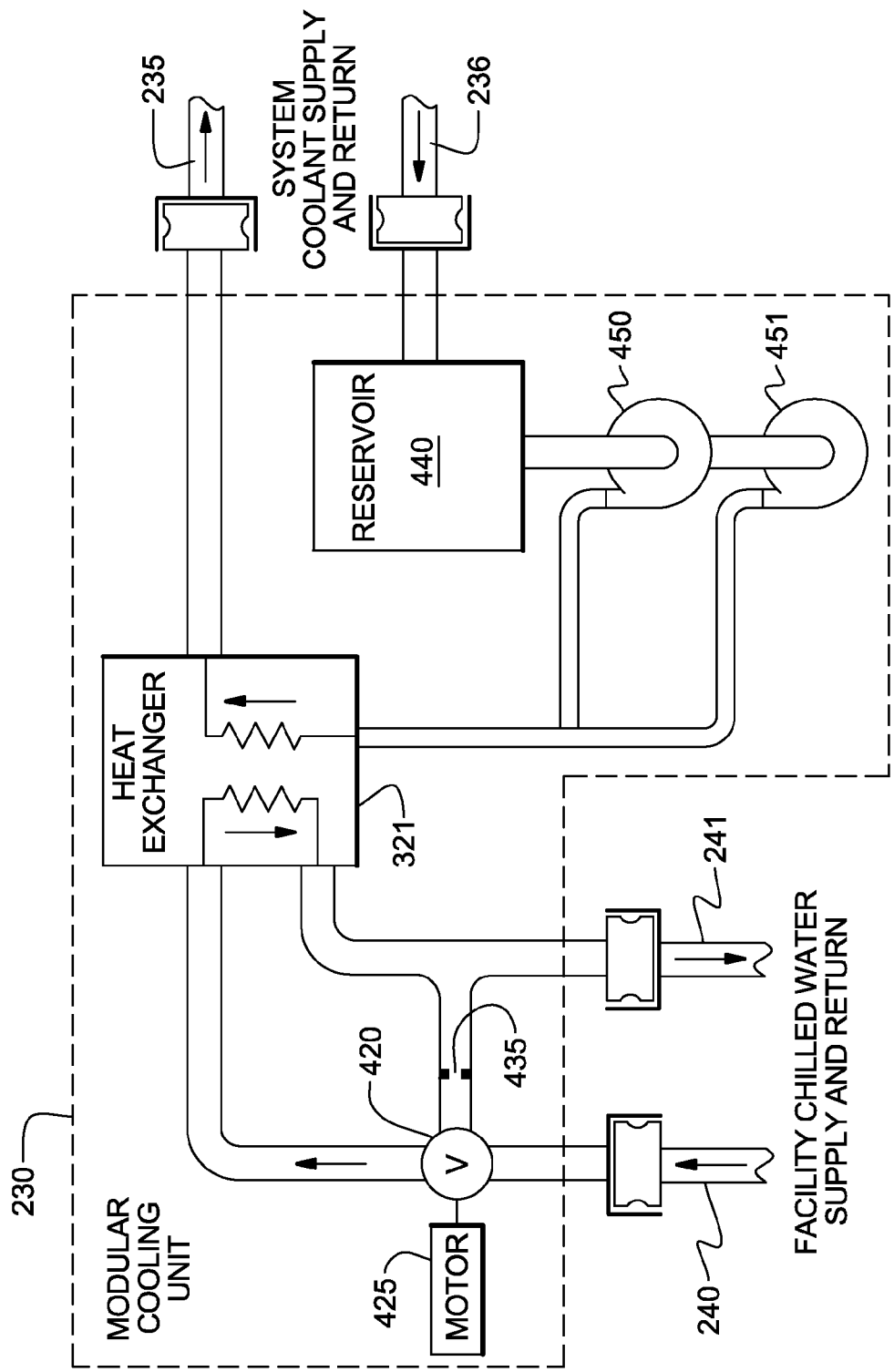
FIG. 4 is a schematic of one embodiment of a modular cooling unit for a liquid-cooled electronics rack such as illustrated in FIG. 2, in accordance with an aspect of the present invention.

FIG. 4 depicts one detailed embodiment of a modular cooling unit 230. As shown in FIG. 4, modular cooling unit 230 includes a facility coolant loop, wherein building chilled, facility coolant is provided (via lines 240, 241) and passed through a control valve 420 driven by a motor 425. Valve 420 determines an amount of facility coolant to be passed through heat exchanger 321, with a portion of the facility coolant possibly being returned directly via a bypass orifice 435. The modular cooling unit further includes a system coolant loop with a reservoir tank 440 from which system coolant is pumped, either by pump 450 or pump 451, into liquid-to-liquid heat exchanger 321 for conditioning and output thereof, as cooled system coolant to the electronics rack to be cooled. Each modular cooling unit is coupled to the system supply manifold and system return manifold of the liquid-cooled electronics rack via the system coolant supply hose 235 and system coolant return hose 236, respectively.

Figure 5:
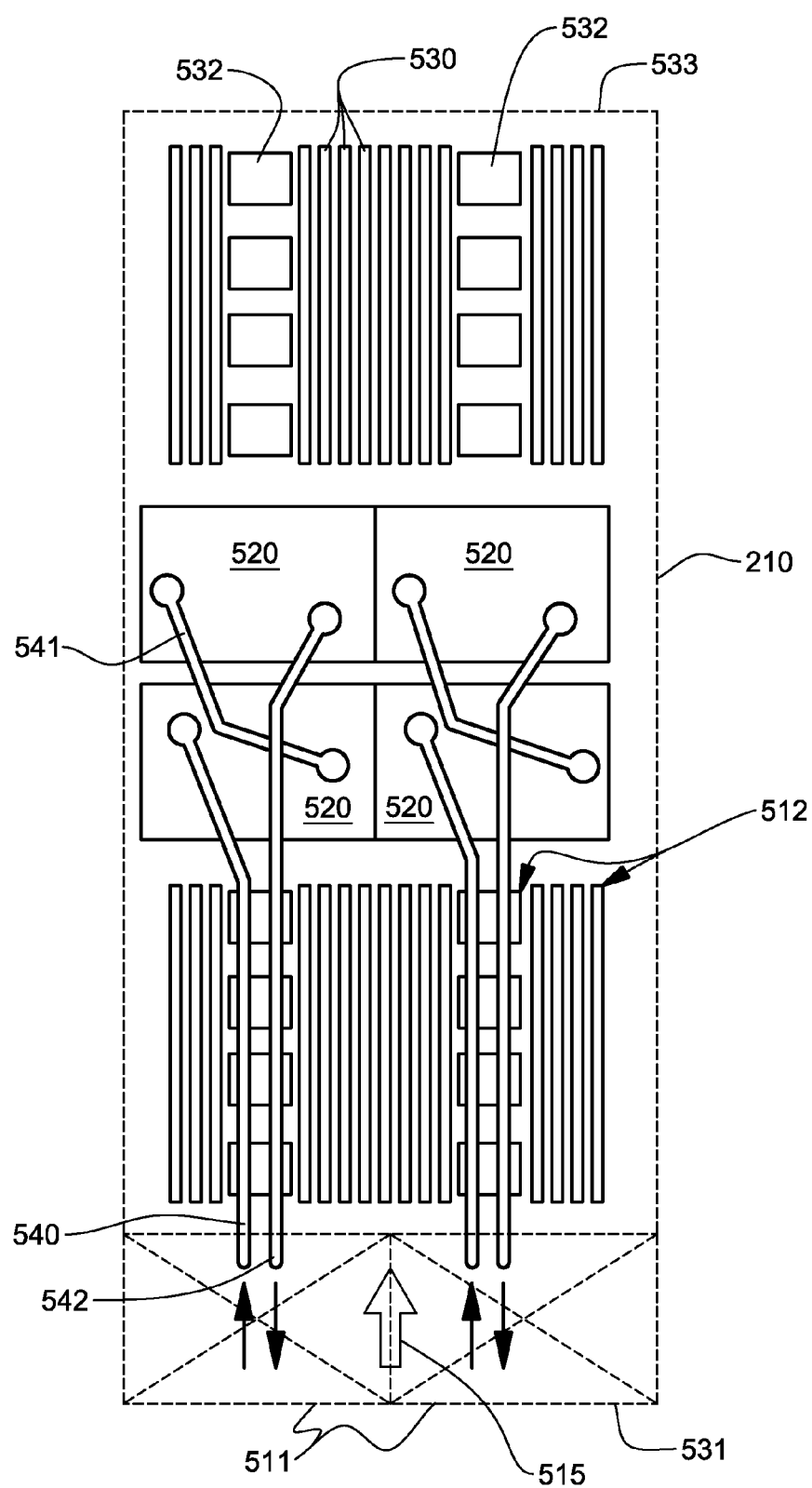
FIG. 5 is a plan view of one embodiment of an electronic subsystem layout illustrating an air and liquid-cooling approach for cooling electronic components of the electronic subsystem, in accordance with an aspect of the present invention.

FIG. 5 depicts another cooling approach, illustrating one embodiment of an electronic subsystem 210 component layout wherein one or more air moving devices 511 provide forced air flow 515 in normal operating mode to cool multiple electronic components 512 within electronic subsystem 210. Cool air is taken in through a front 531 and exhausted out a back 533 of the drawer. The multiple components to be cooled include multiple processor modules to which liquid-cooled cold plates 520 are coupled, as well as multiple arrays of memory modules 530 (e.g., dual in-line memory modules (DIMMs)) and multiple rows of memory support modules 532 (e.g., DIMM control modules) to which air-cooled heat sinks may be coupled. In the embodiment illustrated, memory modules 530 and the memory support modules 532 are partially arrayed near front 531 of electronic subsystem 210, and partially arrayed near back 533 of electronic subsystem 210. Also, in the embodiment of FIG. 5, memory modules 530 and the memory support modules 532 are cooled by air flow 515 across the electronics subsystem.

The illustrated cooling apparatus further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid-coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

As a further cooling approach to providing a liquid-cooled electronics rack, direct immersion-cooling of electronic components of an electronic subsystem of the rack within dielectric fluid (e.g., a liquid dielectric coolant) may be employed. Such an immersion-cooling approach advantageously avoids forced air cooling and enables total liquid-cooling of the electronics rack within a data center. Although indirect liquid-cooling, such as described above in connection with FIGS. 3 and 5, has certain advantages due to the low cost and wide availability of water as a coolant, as well as its superior thermal and hydraulic properties, where possible and viable, the use of dielectric fluid immersion-cooling may offer several unique benefits.

For example, the use of a dielectric fluid that condenses at a temperature above typical outdoor ambient air temperature would enable data center cooling architectures which do not require energy intensive refrigeration chillers. Yet other practical advantages, such as the ability to ship a coolant filled electronic subsystem, may offer benefit over water-cooled approaches such as depicted in FIGS. 3 and 5, which require shipping dry and the use of a fill and drain protocol to insure against freeze damage during transport. Also, the use of liquid immersion-cooling may, in certain cases, allow for greater compaction of electronic components at the electronic subsystem level and/or electronic rack level since conductive cooling structures might be eliminated. Unlike corrosion sensitive water-cooled systems, chemically inert dielectric coolant (employed with an immersion-cooling approach such as described herein) would not mandate copper as the primary thermally conductive wetted metal. Lower cost and lower mass aluminum structures could replace copper structures wherever thermally viable, and the mixed wetted metal assemblies would not be vulnerable to galvanic corrosion, such as in the case of a water based cooling approach. For at least these potential benefits, dielectric fluid immersion-cooling of one or more electronic subsystems of an electronics rack may offer significant energy efficiency and higher performance cooling benefits, compared with currently available hybrid air and indirect water (only) cooled systems.

In the examples discussed below, the dielectric fluid may comprise any one of a variety of commercially available dielectric coolants. For example, any of the Novec™ fluids manufactured by 3M Corporation (e.g., FC-72, FC-86, HFE-7000, and HFE-7200) could be employed. Alternatively, a refrigerant such as R-134a or R-245fa may be employed if desired.

Figure 6A:
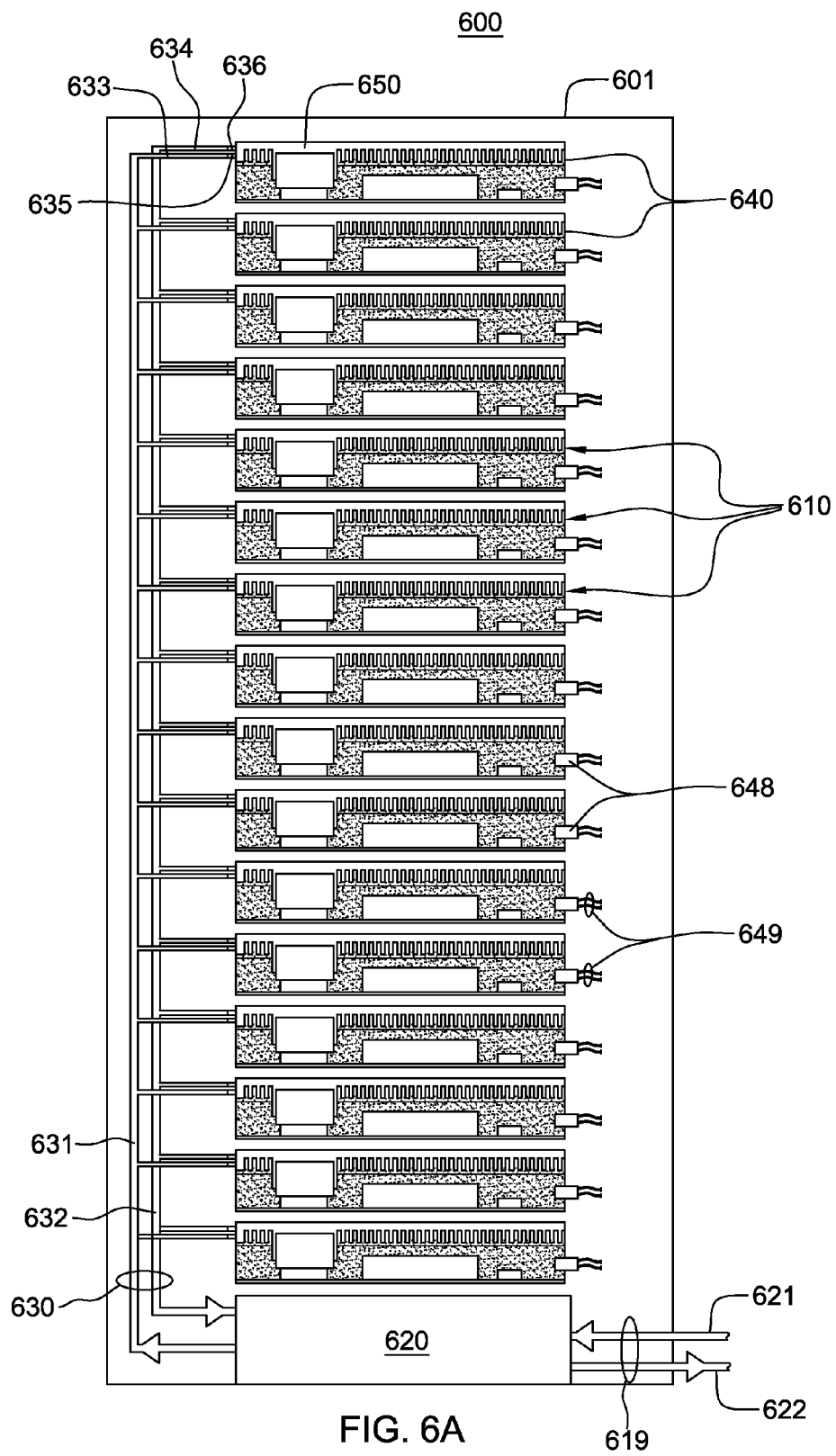
FIG. 6A is an elevational view of one embodiment of a liquid-cooled electronics rack with immersion-cooling of electronic subsystems thereof, in accordance with an aspect of the present invention.

FIG. 6A is a schematic of one embodiment of a liquid-cooled electronics rack, generally denoted 600, employing immersion-cooling of electronic subsystems, in accordance with an aspect of the present invention. As shown, liquid-cooled electronics rack 600 includes an electronics rack 601 containing a plurality of electronic subsystems 610 disposed, in the illustrated embodiment, horizontally so as to be stacked within the rack. By way of example, each electronic subsystem 610 may be a server unit of a rack-mounted plurality of server units. In addition, each electronic subsystem includes multiple electronic components to be cooled, which in one embodiment, comprise multiple different types of electronic components having different heights and/or shapes within the electronic subsystem.

The cooling apparatus is shown to include one or more modular cooling units (MCU) 620 disposed, by way of example, in a lower portion of electronics rack 601. Each modular cooling unit 620 may be similar to the modular cooling unit depicted in FIG. 4, and described above. The modular cooling unit includes, for example, a liquid-to-liquid heat exchanger for extracting heat from coolant flowing through a system coolant loop 630 of the cooling apparatus and dissipating heat within a facility coolant loop 619, comprising a facility coolant supply line 621 and a facility coolant return line 622. As one example, facility coolant supply and return lines 621, 622 couple modular cooling unit 620 to a data center facility coolant supply and return (not shown). Modular cooling unit 620 further includes an appropriately sized reservoir, pump and optional filter for moving liquid-coolant under pressure through system coolant loop 630. In one embodiment, system coolant loop 630 includes a coolant supply manifold 631 and a coolant return manifold 632, which are coupled to modular cooling unit 620 via, for example, flexible hoses. The flexible hoses allow the supply and return manifolds to be mounted within, for example, a door of the electronics rack hingedly mounted to the front or back of the electronics rack. In one example, coolant supply manifold 631 and coolant return manifold 632 each comprise an elongated rigid tube vertically mounted to the electronics rack 601 or to a door of the electronics rack.

In the embodiment illustrated, coolant supply manifold 631 and coolant return manifold 632 are in fluid communication with respective coolant inlets 635 and coolant outlets 636 of individual sealed housings 640 containing the electronic subsystems 610. Fluid communication between the manifolds and the sealed housings is established, for example, via appropriately sized, flexible hoses 633, 634. As explained further below, each coolant inlet 635 and coolant outlet 636 of a sealed housing is coupled to a respective liquid-cooled vapor condenser 650 disposed within the sealed housing 640. Heat removed from the electronic subsystem 610 via the respective liquid-cooled vapor condenser 650 is transferred from the system coolant via the coolant outlet manifold 632 and modular cooling unit 620 to facility coolant loop 619. In one example, coolant passing through system coolant loop 630, and hence, coolant passing through the respective liquid-cooled vapor condensers 650 is water.

Note that, in general, fluidic coupling between the electronic subsystems and coolant manifolds, as well as between the manifolds and the modular cooling unit(s) can be established using suitable hoses, hose barb fittings and quick disconnect couplers. In the example illustrated, the vertically-oriented coolant supply and return manifolds 631, 632 each include ports which facilitate fluid connection of the respective coolant inlets and outlets 635, 636 of the housings (containing the electronic subsystems) to the manifolds via the flexible hoses 633, 634. Respective quick connect couplings may be employed to couple the flexible hoses to the coolant inlets and coolant outlets of the sealed housings to allow for, for example, removal of a housing and electronic subsystem from the electronics rack. The quick connect couplings may be any one of various types of commercial available couplings, such as those available from Colder Products Co. of St. Paul, Minn., USA or Parker Hannifin of Cleveland, Ohio, USA.

One or more hermetically sealed electrical connectors 648 may also be provided in each sealed housing 640, for example, at a back surface thereof, for docking into a corresponding electrical plane of the electronics rack in order to provide electrical and network connections 649 to the electronic subsystem disposed within the sealed housing when the electronic subsystem is operatively positioned within the sealed housing and the sealed housing is operatively positioned within the electronics rack.

As illustrated in FIG. 6B, electronic subsystem 610 comprises a plurality of electronic components 642, 643 of different height and type on a substrate 641, and is shown within sealed housing 640 with the plurality of electronic components 642, 643 immersed within a dielectric fluid 645. Sealed housing 640 is configured to at least partially surround and form a sealed compartment about the electronic subsystem with the plurality of electronic components 642, 643 disposed within the sealed compartment. In an operational state, dielectric fluid 645 pools in the liquid state at the bottom of the sealed compartment and is of sufficient volume to submerge the electronic components 642, 643. The electronic components 642, 643 dissipate varying amounts of power, which cause the dielectric fluid to boil, releasing a dielectric fluid vapor, which rises to the upper portion of the sealed compartment of the housing.

The upper portion of sealed housing 640 is shown in FIG. 6B to include liquid-cooled vapor condenser 650. Liquid-cooled vapor condenser 650 is a thermally conductive structure which includes a liquid-cooled base plate 652, and a plurality of thermally conductive condenser fins 651 extending therefrom in the upper portion of the sealed compartment. A plenum structure 654 comprises part of liquid-cooled base plate 652, and facilitates passage of system coolant through one or more channels 653 (FIG. 6B) in the liquid-cooled base plate 652. In operation, the dielectric fluid vapor contacts the cool surfaces of the thermally conductive condenser fins and condenses back to liquid phase, dropping downwards towards the bottom of the sealed compartment.

System coolant supplied to the coolant inlet of the housing passes through the liquid-cooled base plate of the liquid-cooled vapor condenser and cools the solid material of the condenser such that condenser fin surfaces that are exposed within the sealed compartment to the dielectric fluid vapor (or the dielectric fluid itself) are well below saturation temperature of the vapor. Thus, vapor in contact with the cool condenser fin surfaces will reject heat to these surfaces and condense back to liquid form. Based on operating conditions of the liquid-cooled vapor condenser 650, the condensed liquid may be close in temperature to the vapor temperature or could be sub-cooled to a much lower temperature.

Referring collectively to FIGS. 6B & 6C, the liquid-cooled vapor condenser of the cooling apparatus presented comprises a first set of thermally conductive condenser fins 655 and a second set of thermally conductive condenser fins 651, wherein the second set of thermally conductive condenser fins 651 are of shorter length than the first set of thermally conductive condenser fins 655. In this example, the first set of thermally conductive condenser fins 655 extend into dielectric fluid 645, and are interleaved (or interdigitated) with multiple fluid-boiling fins 660 extending from a fluid-boiling base 661 of a heat spreader 662 coupled to one or more electronic components 643 of the electronic subsystem. As one example, the second set of thermally conductive condenser fins 651 comprise a plurality of pin fins of any desired configuration, while the first set of thermally conductive condenser fins 655 comprise a plurality of plate fins, which may have a variety of transverse, cross-sectional perimeter configurations. By way of specific example, the first set of thermally conductive condenser fins 655 are illustrated in certain of the figures as rectangular plates depending from liquid-cooled base plate 652. Also note that although depicted in certain figures as cylindrical-shaped pin fins 651, the concepts presented are readily applicable to a variety of different pin fin configurations. For example, the condenser fins 651 might have a square, rectangular, circular, trapezoidal, triangular, parallelogram, part rectangular part curve, etc. transverse cross-sectional perimeter along at least a portion of their length.

As illustrated in FIG. 6C, the thermally conductive plate fins 655 comprise a first main surface and a second main surface, at least one of which are in spaced, opposing relation to respective fluid-boiling fins 660, which in one example, are fluid-boiling plate fins. As illustrated, heat spreader 662 is coupled to at least one electronic component 643 to be cooled, and facilitates transfer of heat from the at least one electronic component 643 to the multiple thermally conductive condenser plate fins 655 of the liquid-cooled vapor condenser. In one example, electronic component 643 may comprise a high heat dissipating component, such as a processor module or multi-chip module of the electronic subsystem. Advantageously, the interleaved condenser plate fins and fluid-boiling plate fins illustrated in FIGS. 6B & 6C allow for localized cooling and condensing of dielectric fluid vapor in the region of the interleaved fins, which reduces dielectric fluid vapor 646 accumulation within the upper portion of the sealed compartment.

Note that the main surfaces of one or more of the thermally conductive plate fins 655 are each in opposing relation with one or more different fluid-boiling plate fins 660 of heat spreader 662. As illustrated, plate fins 655 depend downwards into dielectric fluid 645 adjacent to the respective fluid-boiling plate fins. In this configuration, dielectric fluid vapor bubbles generated by, for example, boiling of dielectric fluid contacting one or more fluid-boiling surfaces, will be cooled and condensed back into liquid state in the vicinity of the heat spreader, thereby facilitating enhanced cooling of the electronic subsystem.

As shown in FIG. 6B, some dielectric fluid vapor 646 will rise to an upper portion of the housing, along with any non-condensable gas (such as air) 647 coming out of solution from the dielectric fluid. Non-condensable gas can reside in solution within the dielectric fluid, but once coming out of solution through the boiling process, cannot be returned to solution through the condensation process.

Those skilled in the art will note from the above description that disclosed herein are interwoven heat source and heat sink surfaces immersed within a dielectric fluid, which results in enhanced cooling of, for example, higher power components of an immersion-cooled electronic subsystem. As one example, these higher power components may comprise processor modules or chips, with condenser fins being provided extending into the spaces between adjacent fluid-boiling fins of the heat spreader coupled to the higher power components. The resultant localized cooling and condensing of dielectric fluid vapor generated by the one or more electronic components reduces the extent of vapor accumulation within the sealed housing, thereby facilitating enhanced cooling of the components of the electronic subsystem. Lower power electronic components, such as electronic components 642 in FIG. 6B, are cooled employing pool boiling of dielectric fluid, without the aid of special structures such as illustrated in FIG. 6C. Note that in FIG. 6C, boiling occurs from the surfaces of the heat spreader in physical contact with the dielectric fluid within which the electronic components are immersed. These surfaces are one example of fluid-boiling surfaces, as the phrase is used herein.

FIGS. 7A-10D depict alternate embodiments of the interwoven heat source and heat sink structures of an immersion-cooled electronic subsystem, such as depicted in FIGS. 6A-6C and described above. Unless otherwise indicated, these alternate embodiments of a cooling apparatus are similar or identical to the cooling apparatus described above in connection with FIGS. 6A-6C.

Figure 7A:
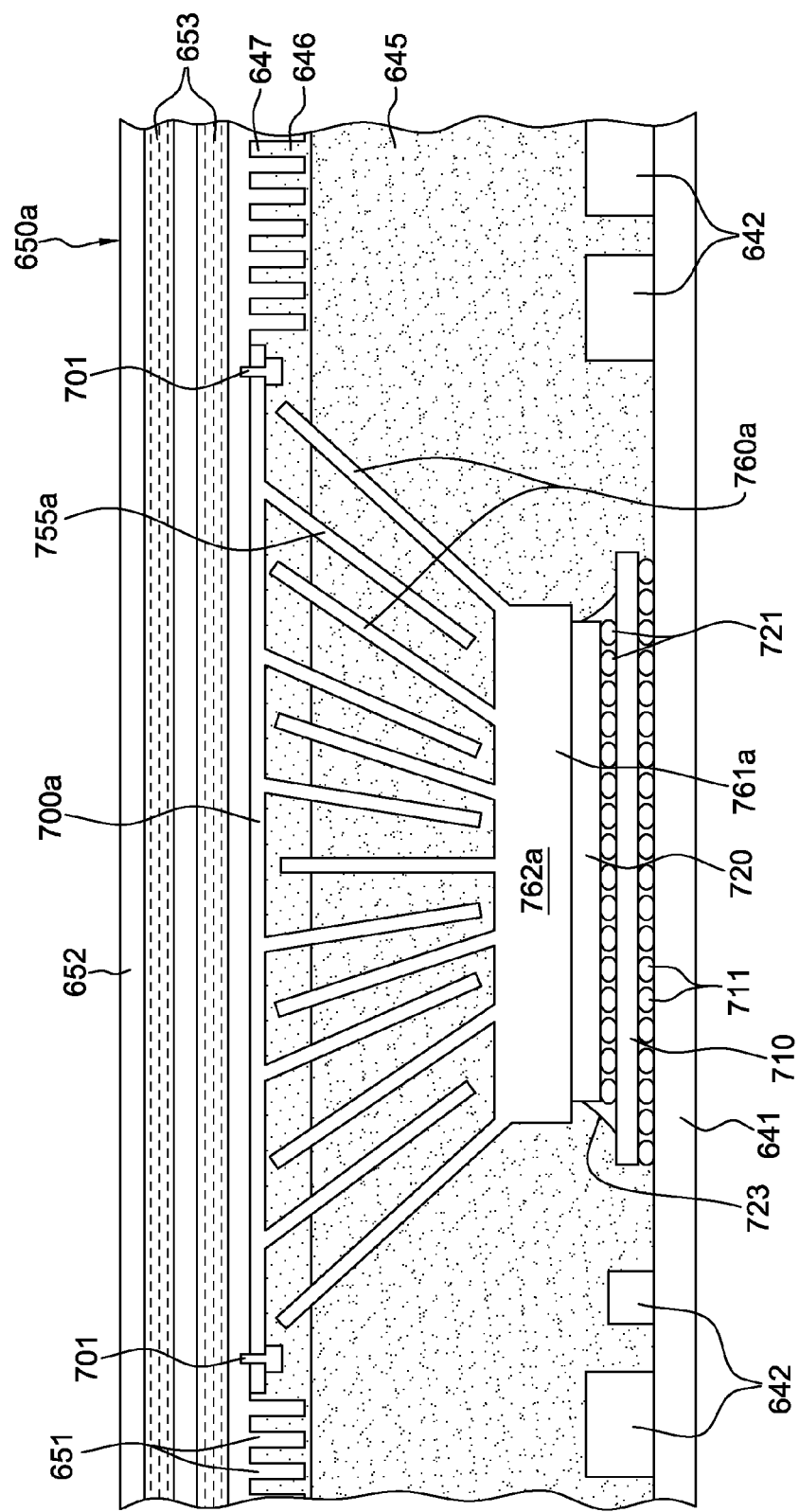
FIG. 7A is a partial cross-sectional elevational view of an alternate embodiment of the immersion-cooled electronic subsystem of FIGS. 6B-6C, in accordance with an aspect of the present invention.

FIG. 7A illustrates an alternate implementation of an immersion-cooled electronic subsystem of a liquid-cooled electronics rack, in accordance with an aspect of the present invention. In this implementation, the liquid-cooled vapor condenser 650a further includes a condenser fin base support 700a, which is secured to the liquid-cooled base plate 652 via attachment mechanisms 701. Attaching to the liquid-cooled base plate can be achieved in several way using, for example, tools inserted from the side or using bosses in the base plate to allow access to the attachment mechanisms from the top of the condenser. In one embodiment, heat spreader 762a may be attached to one or more electronic components of the electronic subsystem using a permanent joint material, such as solder or epoxy. Multiple thermally conductive condenser fins 755a extend from condenser fin base support 700a and are angled to extend in an at least partially converging manner from condenser fin base support 700a. Similarly, multiple fluid-boiling fins 760a of heat spreader 762a extend in an at least partially diverging manner from fluid-boiling base 761a. These converging condenser fins and diverging fluid-boiling fins are interleaved as illustrated in FIG. 7A.

As illustrated in FIG. 7A, the volume occupied by the dielectric fluid between the interleaved thermally conductive condenser fins and fluid-boiling fins has a diverging shape upwards from the heat spreader, with the smaller volume being closer to the fluid-boiling base of the heat spreader, and the larger volume closer to the condenser fin base support of the liquid-cooled vapor condenser. In operation, dielectric fluid in liquid state pools in the region of smaller volume over fluid-boiling base 761a of heat spreader 762a, and dielectric fluid vapor rises and accumulates in the region of larger volume adjacent to condenser fin base support 700a of liquid-cooled vapor condenser 650a.

Advantageously, the length of the interdigitated fins in this design will be longer than the fin lengths illustrated for the design of FIGS. 6A-6C. That is, the interleaved converging and diverging fin characteristic of the condenser and boiling fins means fins of greater heat transfer surface area can be used for both the fluid-boiling surfaces and the vapor condensing surfaces.

In practice, the interleaved thermally conductive condenser fins of the vapor condenser and fluid-boiling fins of the heat spreader may be manufactured separately as a subassembly that is first attached to either the heat source (i.e., the one or more electronic components) or the heat sink (i.e., liquid-cooled vapor condenser), and then attached to the other of the heat source and heat sink. While the fluid-boiling fins and thermally conductive condenser fins may be structurally interleaved (i.e., interdigitated), they are spaced from and able to move relative to each other, which facilitates attachment of the interleaved structures to the different heat source and heat sink surfaces.

In FIG. 7A, heat spreader 762a is attached to an integrated circuit chip 720 via, for example, a solder or epoxy interface (not shown), and the condenser fin base support 700a is attached to the larger liquid-cooled base plate 652 via attachment mechanisms 701 and, for example, a thermal interface material to improve thermal contact between the two mating surfaces. Integrated circuit chip 720 is electrically connected to wiring of a substrate 710 via, for example, solder bump connections 721, and an underfill material 723 surrounds solder bump connections 721 of integrated circuit chip 720 and substrate 710. Substrate 710 is itself electrically connected to, for example, an electronic subsystem substrate 641 via a second set of solder bump connections 711. Also shown in FIG. 7A are lower power electronic components 642, which are cooled by immersion-cooling within the dielectric fluid, for example, by boiling dielectric fluid to generate dielectric fluid vapor. In one embodiment, liquid-cooled vapor condenser 650a resides in the upper portion of the sealed compartment, and has a footprint which extends across and fills the upper portion thereof. In one specific implementation, the vapor condenser has a footprint approximately equal to the footprint of the electronic subsystem within the sealed compartment.

Also depicted in FIG. 7A is a step between the compartment facing surfaces of condenser fin base support 700a and liquid-cooled base plate 652. Advantageously, any non-condensable gas 647 is likely to accumulate at the highest level of the sealed compartment, that is, on either side of the condenser fin base support, which will yield improved performance of the interleaved condenser and heat spreader subassembly (since the non-condensable gases will accumulate elsewhere within the sealed compartment).

In addition to condensing locally-generated dielectric fluid vapor, the condenser fins extending into the dielectric fluid also locally sub-cool the fluid, yielding better boiling performance through a reduction in vapor bubble diameter at the boiling surfaces of structures 760a and 761a. Note also that layered coolant channels 653 within liquid-cooled base plate 652 in FIG. 7A are provided by way of example only. If desired, a single layer of coolant channels, or more than two layers, could be employed within the liquid-cooled base plate. In addition, the coolant channels could be, for example, simple cylindrical tubes or openings in the base plate, or could have one or more fin structures extending therein for an enhanced heat transfer area between the base plate and system coolant flowing through the base plate. In this regard, see the embodiment of FIG. 8, which is described below.

Referring collectively to FIGS. 7B & 7C, a variation of the immersion-cooled electronic subsystem of FIG. 7A is illustrated. This embodiment is identical to the immersion-cooled electronic subsystem of FIG. 7A, with the exception being the addition of a porous filler material 730 suspended within the sealed compartment between, for example, one or more electronic components 642 and the thermally conductive condenser fins 651 of the liquid-cooled vapor condenser 650a. Advantageously, this suspended porous filler material is provided, in one embodiment, to reduce an amount of dielectric fluid required within the sealed compartment to achieve full immersion of the electronic subsystem's plurality of electronic components and immersion of the interleaved fins discussed above. Thus, porous filler material 730 resides at least partially, if not fully, below the dielectric liquid level within the sealed compartment in order to displace the dielectric fluid, and thereby reduce the amount of dielectric fluid needed for immersion-cooling of electronic components of the electronic subsystem (as well as the interleaved condenser and boiling fin subassembly). In one embodiment, porous filler material 730 is a low-weight polymeric filler material having a lower cost and lower weight than the dielectric fluid. This lighter weight and lower cost filler material also serves to reduce the weight and cost of the cooling apparatus. The filler material may, in one embodiment, include a plurality of spherical or other shaped, sealed air pockets (or volumes), which would serve to further reduce the weight of the filler material and reduce the amount of filler material required to manufacture the immersion-cooled electronic subsystem. One or more vertically-oriented cavities or channels 731 are provided through the filler material to allow for the rising of dielectric fluid vapor (or warm dielectric fluid) through the filler material, and the falling of a film or droplets of dielectric fluid condensate from the upper portion of the sealed compartment to the lower portion of the sealed compartment through the filler material.

Figure 7D:
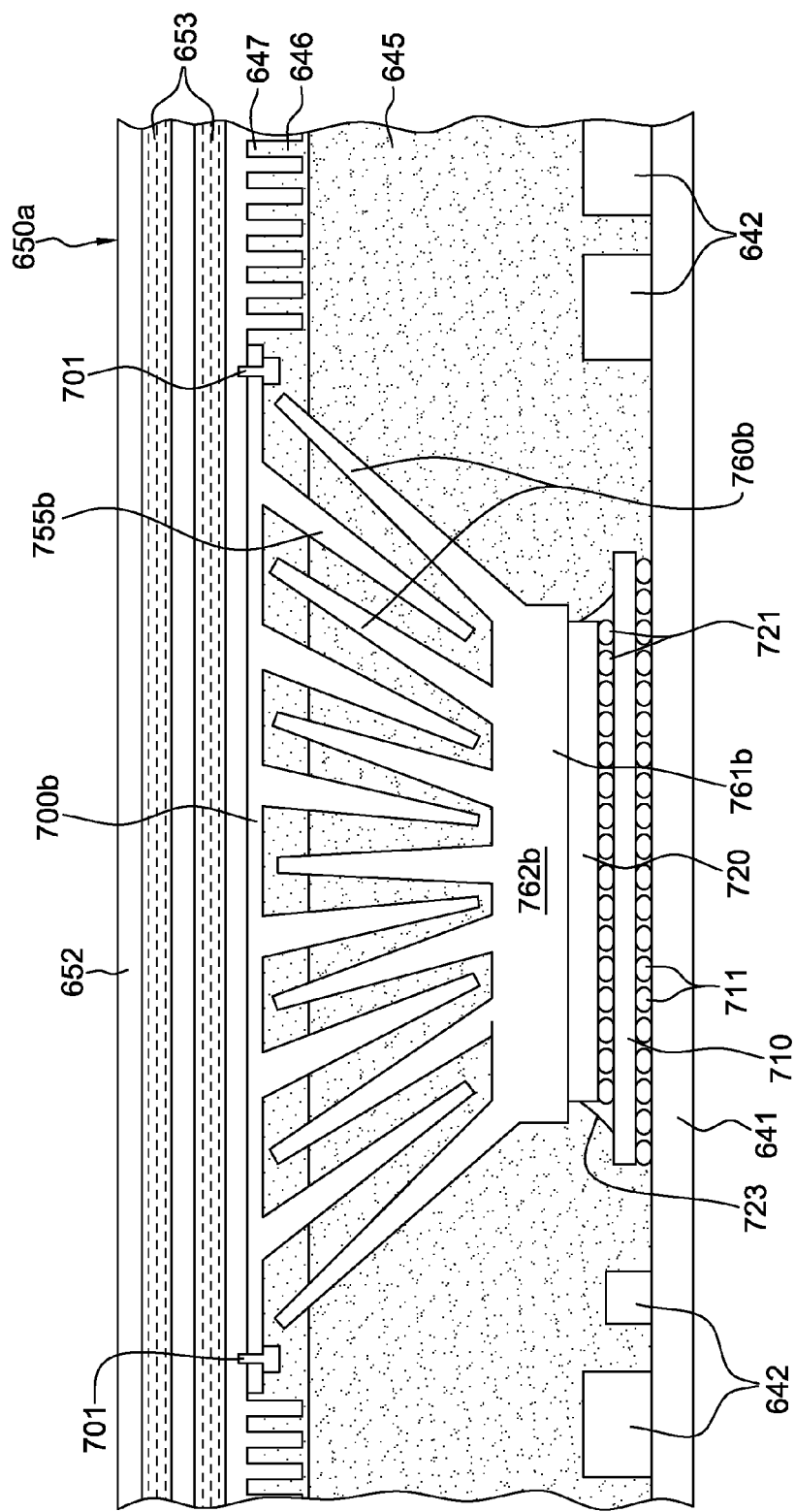
FIG. 7D is a partial cross-sectional elevational view of another embodiment of an immersion-cooled electronic subsystem, in accordance with an aspect of the present invention.

FIG. 7D illustrates another embodiment of an immersion-cooled electronic subsystem, such as described above in connection with FIGS. 6B-7A. In this embodiment, the multiple thermally conductive condenser fins 755b and multiple fluid-boiling fins 760b (extending from fluid-boiling base 761b) of the liquid-cooled vapor condenser 650a and heat spreader 762b, respectively, are similar to the converging condenser fins and diverging fluid-boiling fins described above in FIG. 7A, but with roughly triangular-shaped, elongate cross-sections. As one example, the thermally conductive condenser fins may each comprise thermally conductive condenser plate fins with transverse cross-sectional perimeters which vary along at least a portion of the length thereof from condenser fin base support 700b towards heat spreader 762b. Similarly, the diverging fluid-boiling fins 760b of heat spreader 762b may each be a fluid-boiling plate fin having a transverse cross-sectional perimeter which varies along at least a portion of a length thereof from the fluid-boiling base 761b of the heat spreader towards the vapor condenser 650a. In the illustrated example, the transverse cross-sectional perimeters of both the thermally conductive condenser fins and the fluid-boiling fins decrease along the length of the respective fins from their base outwards. This configuration of fins yields an optimal mass fin shape that performs better with respect to heat dissipation rate per unit fin mass compared to, for example, a plate fin having a rectangular cross-sectional shape that has a consistent transverse cross-sectional perimeter along its length. The illustrated fin shape also allows for greater fin material in regions of higher heat transfer coefficients in both the condenser and boiler regions, that is, at the respective fin bases. A heat spreader with fluid-boiling plate fins as described herein (having the illustrated cross-section) can be readily manufactured using commercial extrusion processes. The interleaved fin subassembly can be assembled (in one embodiment) by sliding the respective condenser and heat spreader structures in a direction, for example, perpendicular, to the page of the illustrated figure. Note that the illustrated fluid-boiling and condenser fins can also be used in a non-diverging (i.e., non-diverging fluid-boiling fins) and non-converging (i.e., non-converging condenser fins) subassembly, such as the subassembly illustrated in FIG. 6C.

Figure 7E:
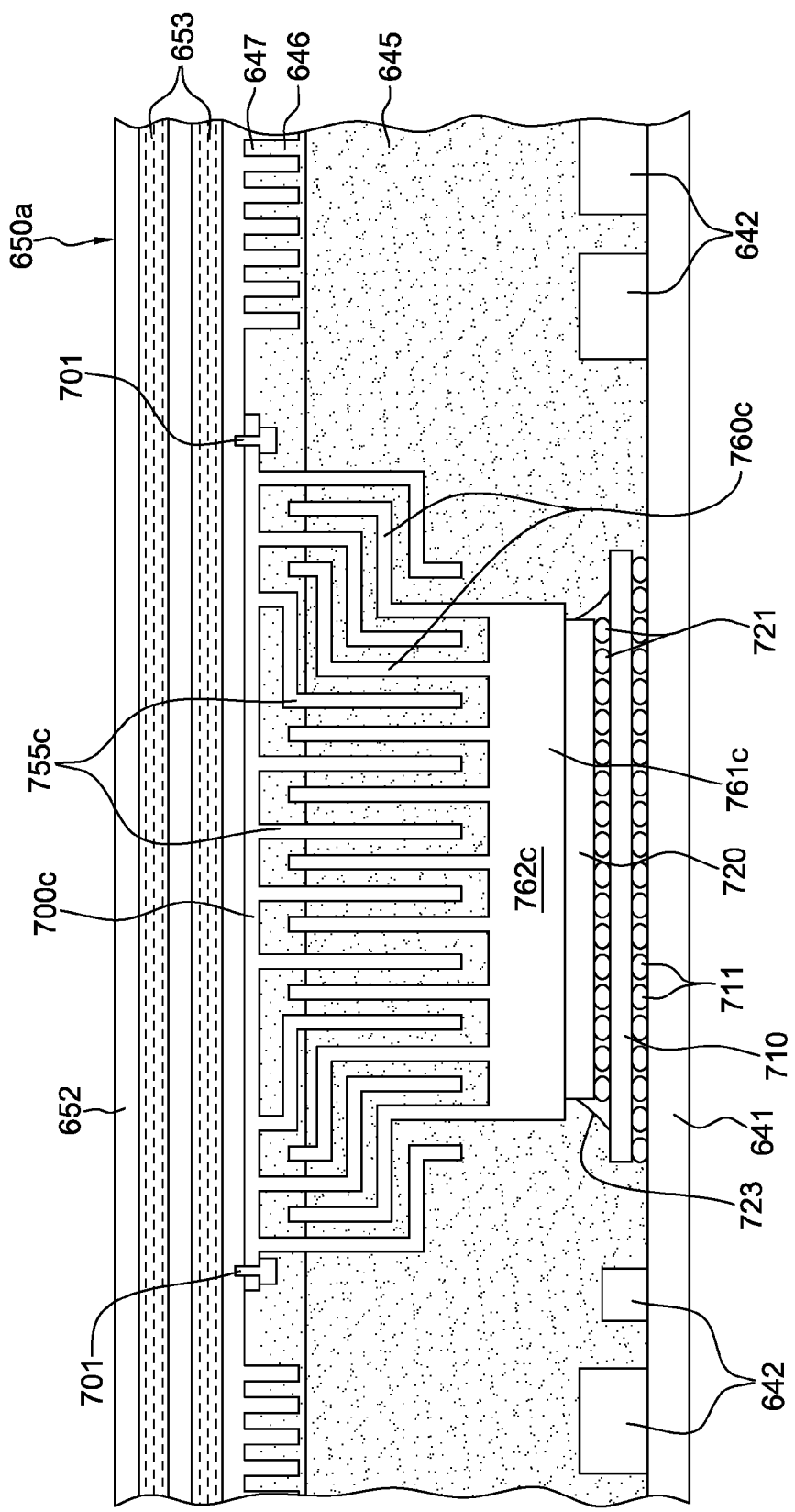
FIG. 7E is a partial cross-sectional elevational view of a further embodiment of an immersion-cooled electronic subsystem, in accordance with an aspect of the present invention.

FIG. 7E illustrates a further embodiment of an immersion-cooled electronic subsystem, in accordance with an aspect of the present invention. In this embodiment, one or more of the condenser fins 755c are made longer than one or more other condenser fins 755c by, for example, providing one or more bends in the longer condenser fins. In this embodiment, the longer condenser fins are illustrated to comprise two right-angle bends, forming zig-zag-shaped fins which are interleaved with corresponding zig-zag-shaped fluid-boiling fins 760c of heat spreader 762c. As with the condenser fins, one or more fluid-boiling fins 760c are shown to comprise a longer length than one or more other fluid-boiling fins 760c of heat spreader 762c. The zig-zag shapes of selected condenser fins and fluid-boiling fins results in the longer fin lengths, and thus, greater fin heat transfer surface areas compared with the straight condenser and fluid-boiling fins in the central region of the interleaved vapor condenser and heat spreader. The zig-zag-shaped fins can be manufactured using a low-cost stamping and folding process, as will be understood by one skilled in the art, and the interleaved fin subassembly can be achieved by sliding the fins relative to each other in a direction perpendicular to the illustrated drawing page.

Figure 7F:
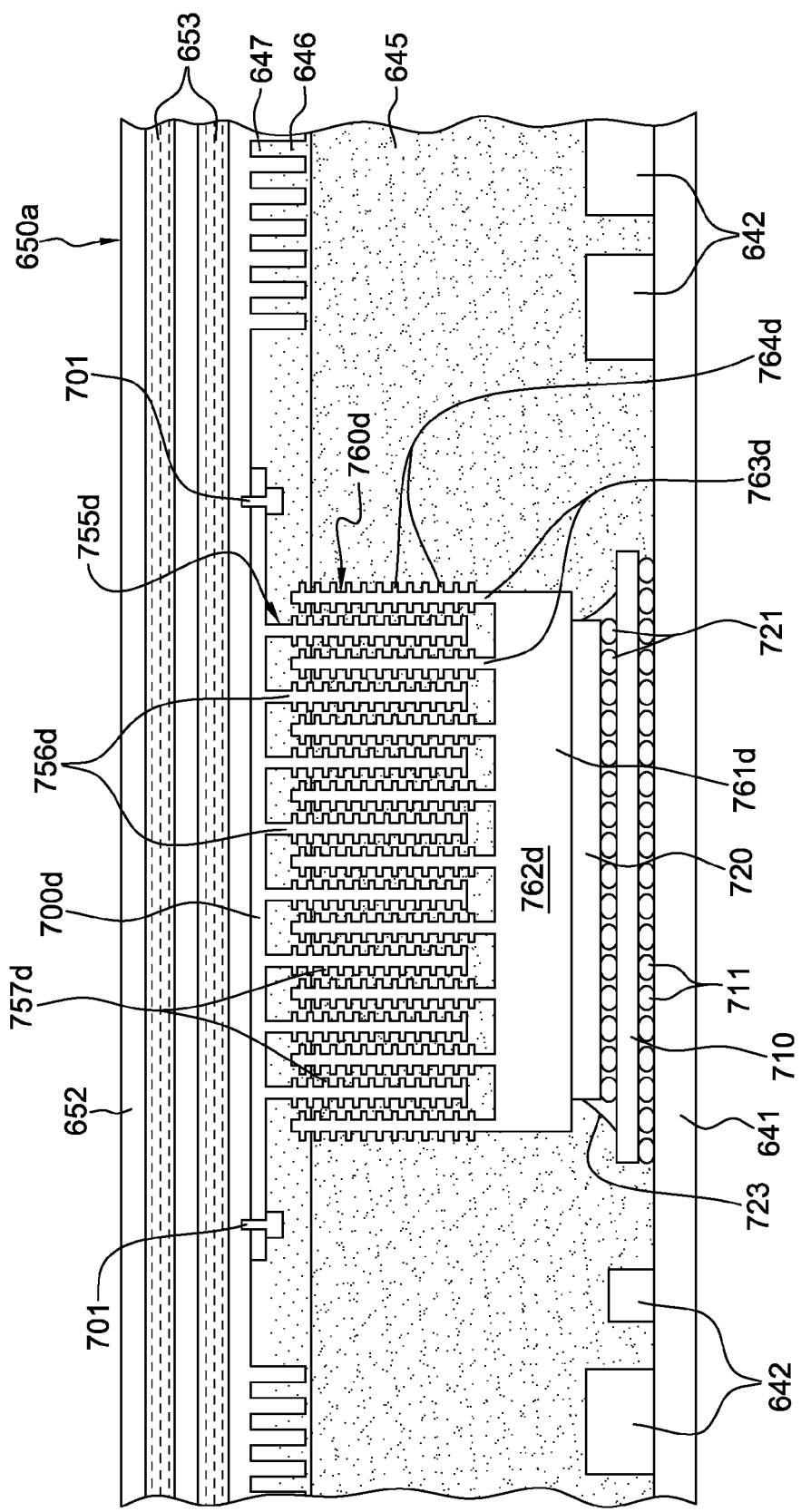
FIG. 7F is a partial cross-sectional elevational view of another embodiment of an immersion-cooled electronic subsystem, in accordance with an aspect of the present invention.

FIG. 7F illustrates an immersion-cooled electronic subsystem with a different type of interwoven heat spreader and heat sink (i.e., vapor condenser) structure, wherein fluid-boiling fins 760d each comprise a primary fluid-boiling fin 763d and a plurality of secondary fluid-boiling fins 764d extending from the main surfaces thereof in opposing relation with a respective thermally conductive condenser fin 755d. Similarly, each thermally conductive condenser fin 755d comprises a primary condenser fin 756d having a first main surface and a second main surface from which a plurality of secondary condenser fins 757d extend. In this embodiment, in addition to interleaving the primary fluid-boiling 763d and primary condenser fins 756d, there is a secondary interleaving of the plurality of secondary fluid-boiling fins 764d with the plurality of secondary condensing fins 757d extending from the opposing primary fluid-boiling and primary condensing fins. Note that, although spatially offset, the fins of the condenser and heat spreader can either overlap each other, or not. The use of multiple hierarchically-nested fins, such as depicted in FIG. 7F, provides a greater heat transfer surface area within an available volume to accommodate the condenser and heat spreader fin subassembly. As with the other embodiments, the subassembly of FIG. 7F can be manufactured separately and subsequently coupled to the liquid-cooled base plate and to the one or more electronic components to be cooled.

Figure 8:
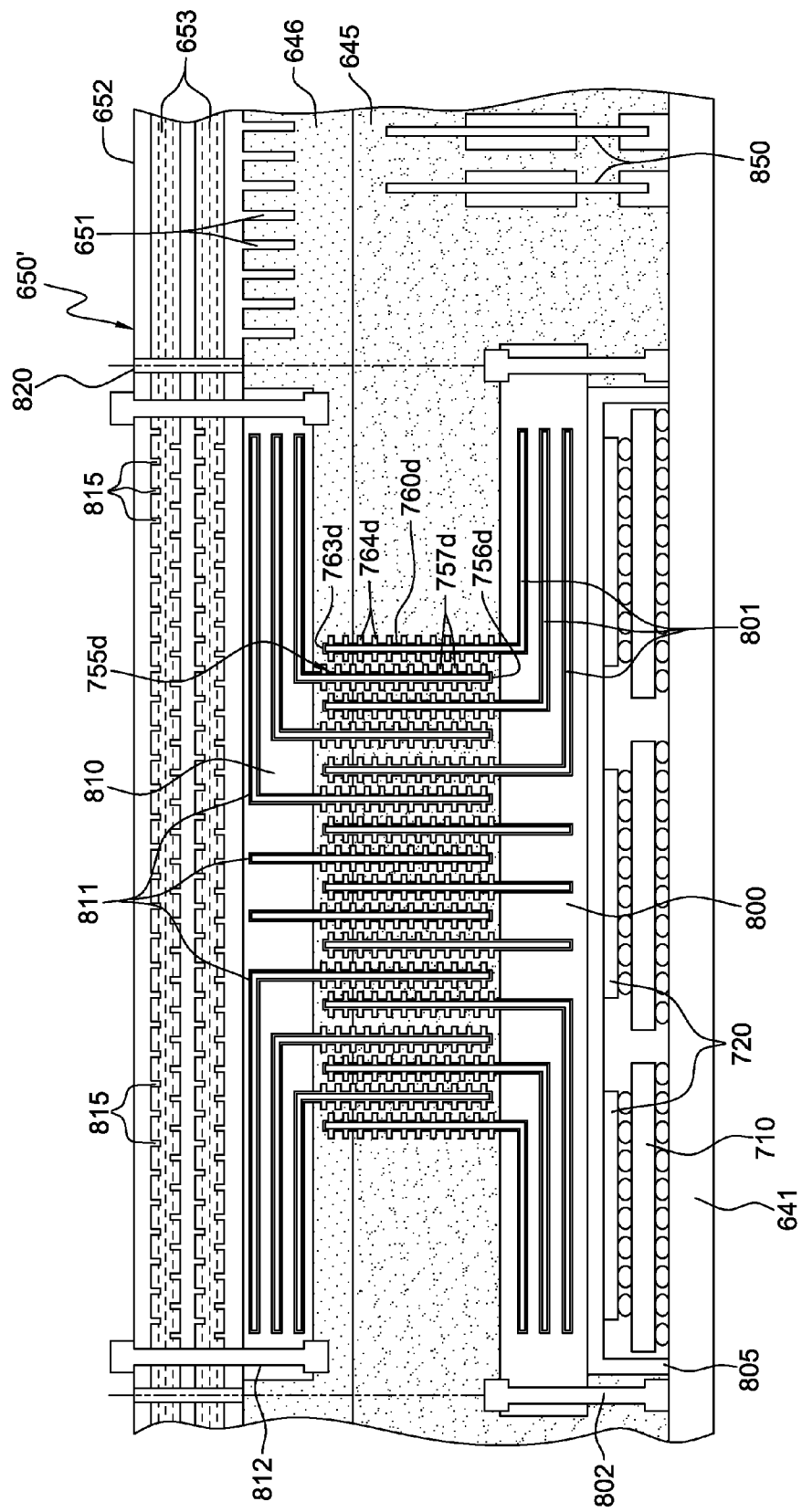
FIG. 8 is a partial cross-sectional elevational view of a further embodiment of an immersion-cooled electronic subsystem, in accordance with an aspect of the present invention.

FIG. 8 depicts a variation of the immersion-cooled electronic subsystem of FIG. 7F. In this embodiment, heat pipes 801, 811 are provided within the fluid-boiling and condenser fins 760d, 755d. As illustrated, heat pipes 801, 811 are embedded within the fluid-boiling base 800 and condenser fin base support 810, respectively. Note that in an alternative configuration, the heat pipes may exclusively be provided within either the heat spreader or within the vapor condenser structures.

Advantageously, the use of heat pipes facilitates extraction of heat from a larger footprint of the heat spreader, and the rejection of this heat to a larger footprint of the vapor condenser, while enabling the actual heat sink and condenser fin subassembly to have a footprint that is much less than the heat generating and heat rejecting sides of the subassembly. Note also that, although shown with secondary fins on both the heat spreader side and condenser side of the subassembly, the heat pipe concept could be employed with any of the interleaved fin subassemblies of the immersion-cooled electronic subsystems illustrated herein.

Also illustrated in FIG. 8 are DIMM card arrays 850, which are cooled by dielectric fluid 645 and the plurality of thermally conductive condenser fins 651 disposed above the DIMM card arrays. One or more higher-power processor chips 720 are illustrated in FIG. 8 coupled via respective substrates 710 to a common electronic subsystem substrate (or board) 641. A common thermally conductive lid or cover 805 is provided over the one or more higher-power processor chips 720.

In one fabrication implementation, a heat spreader with the illustrated heat pipes and primary and secondary fluid-boiling fins is manufactured as a single unit, and brought down onto the electronic subsystem substrate in contact with the multi-chip module lid 805, and then tightly attached to the substrate via multiple attachment mechanisms 802 through access openings 820, which are sealed (not shown) after attachment of the attachment mechanisms 802. In practice, a thermal interface material (not shown) may be placed between the fluid-boiling base 800 and the multi-chip module lid 805. Once the heat spreader assembly has been attached, attachment mechanisms 812 on the upper side of the liquid-cooled base plate may be used to secure the condenser fin base support 810 to the base plate 652. The process can be reversed if the condenser body is to be lifted off of the electronic subsystem board or substrate.

FIG. 8 also illustrates certain internal surfaces of the embedded coolant channels 653 possessing fins 815 to enhance heat transfer surface area in the region of the interleaved vapor condenser and heat spreader subassembly, and thus provide a higher heat transfer coefficient over the higher-performing condenser heat sink region. Although the interleaved heat spreader and vapor condenser structure can be fabricated as a separate subassembly, the fins possess the ability to move relative to each other, which allows the attachment process to be more readily performed. The sealed housing described above in connection with FIGS. 6A-6C encapsulates both the electronic subsystem substrate and the vapor condenser, which would be inserted into the housing after they have been assembled relative to each other (in one embodiment).

FIG. 9A is a partial schematic of one embodiment of a vertically-oriented, immersion-cooled electronic subsystem, generally denoted 900, in accordance with an aspect of the present invention. In one embodiment, multiple such electronic subsystems may be inserted vertically into a larger housing, such as an electronics rack (not shown). Liquid cooling for the liquid-cooled vapor condenser 950 may be provided as described above in connection with the liquid-cooled electronics rack embodiment of FIGS. 6A-6C. As illustrated in FIG. 9A, immersion-cooled electronic subsystem 900 includes a plurality of electronic components, 920, 942 of different height and type on a substrate 941. The substrate 941 is shown within a sealed housing 940 with the plurality of electronic components 920, 942 immersed within a dielectric fluid 945. Sealed housing 940 is configured to at least partially surround and form a sealed compartment about the electronic subsystem, with the plurality of electronic components 920, 942 disposed within the sealed compartment. Electronic components 920, 942 dissipate varying amounts of power, which causes the dielectric fluid to boil, releasing a dielectric fluid vapor, which rises towards the upper portion of the sealed compartment of the housing.

In the embodiment illustrated, electronic component 920 may comprise a high-power processor chip or multi-chip module which is electrically coupled via multiple solder bump connections 912 to a substrate 910, itself coupled to electronic subsystem substrate 941 via multiple additional solder bump connections 911. An underfill material 923 fills the gaps between substrate 910 and electronic component 920. In this embodiment, electronic component 920 is assumed to be a significantly higher heat-generating component compared with electronic component 942 of the electronic subsystem. As such, a heat spreader 962 is provided comprising a fluid-boiling base 961 and a plurality of fluid-boiling fins 960 extending therefrom and sloping in an upwards direction. Facing heat spreader 962 is liquid-cooled vapor condenser 950, which includes a first set of thermally conductive condenser fins 955 and a second set of thermally conductive condenser fins 951. The thermally conductive condenser fins 955 are shown to be interleaved with the fluid-boiling fins 960 of heat spreader 962, and to extend in a downwards-sloping manner from a liquid-cooled base plate 952 (comprising one or more coolant-carrying channels 953), towards heat spreader 962.

Advantageously, the provision of sloped fins provides a greater fin surface area, and the provision of sloped fins relative to the vertical orientation of the electronics subsystem facilitates an alignment of the fins with the natural recirculation pattern that would arise from the boiling and condensation processes within the sealed compartment. This is illustrated in FIG. 9B, where dielectric fluid condensate 970 flows downward along the sloped surfaces of condenser fins 955, and dielectric vapor 971 rises upwards along the sloped surfaces of fluid-boiling fins 960. Alternatively, the sloped fins could be designed to allow for the liquid-cooled vapor condenser to drop down towards the electronic subsystem substrate 941, or extend down at an angle that is parallel to the plane of the heat spreader and condenser fins.

Figure 10A:
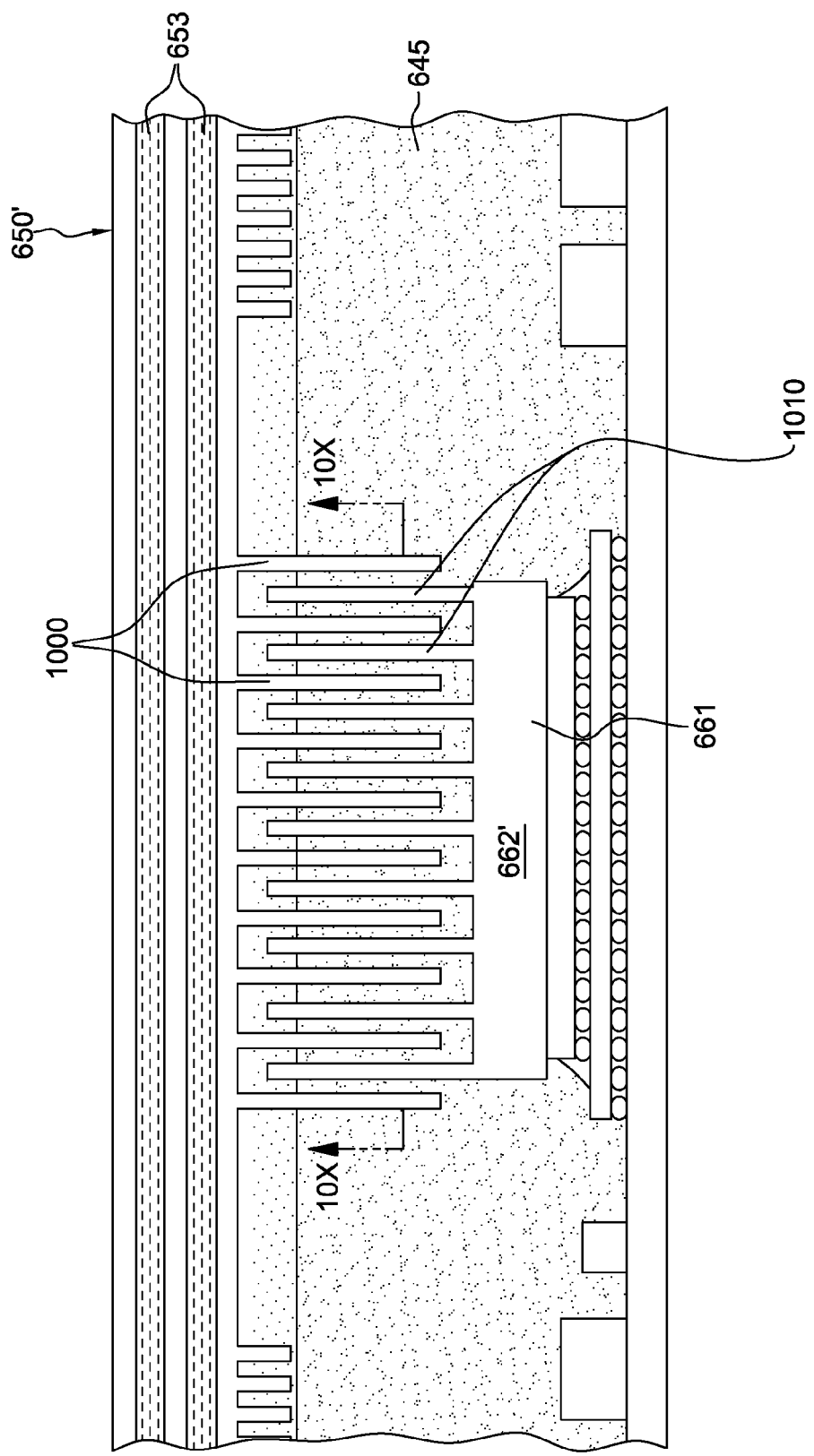
FIG. 10A is a partial cross-sectional elevational view of another embodiment of an immersion-cooled electronic subsystem, in accordance with an aspect of the present invention.
Figure 10B:
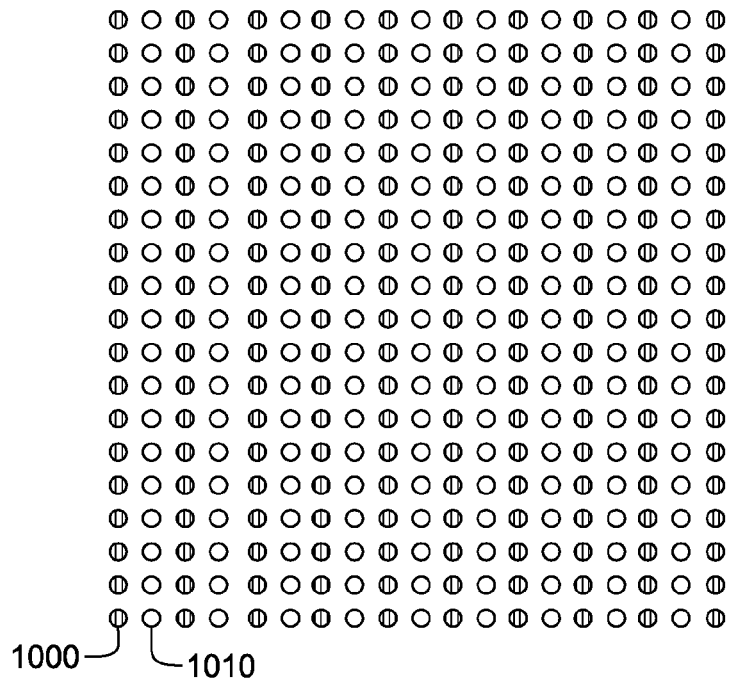
FIG. 10B is a partial cross-sectional elevational view of the immersion-cooled electronic subsystem of FIG. 10A, taken along line 10X-10X thereof, and illustrating one embodiment of an interleaved pin fin pattern, in accordance with an aspect of the present invention.
Figure 10C:
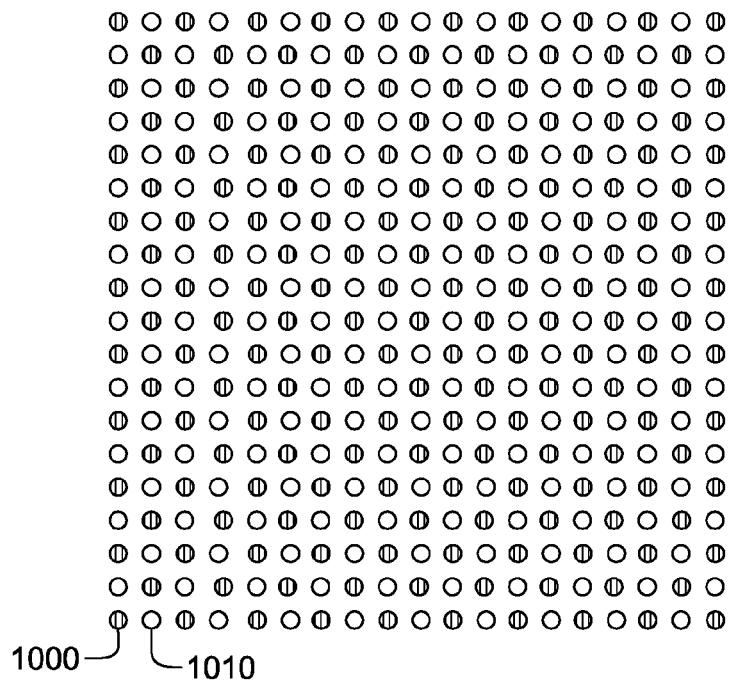
FIG. 10C is a partial cross-sectional elevational view of the immersion-cooled electronic subsystem of FIG. 10A, taken along line 10X-10X thereof, and illustrating another embodiment of an interleaved pin fin pattern, in accordance with an aspect of the present invention.
Figure 10D:
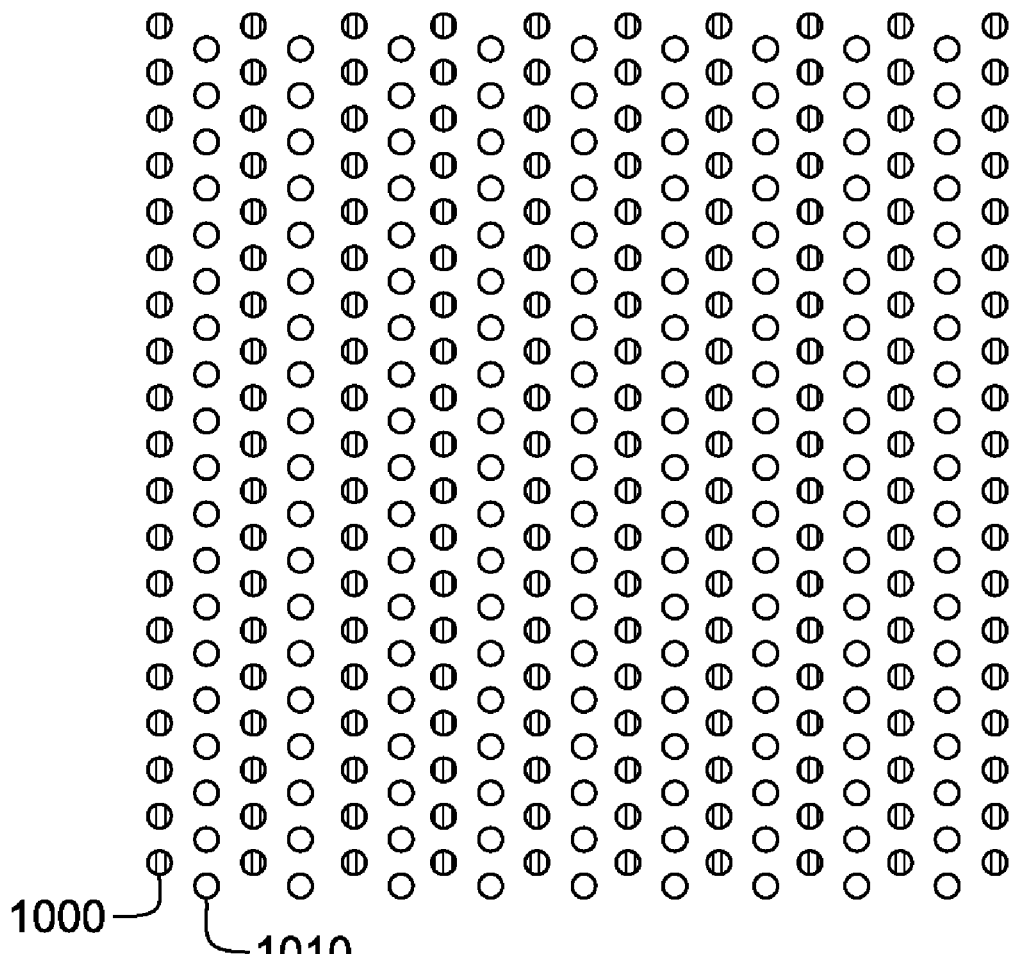
FIG. 10D is a partial cross-sectional elevational view of the immersion-cooled electronic subsystem of FIG. 10A, taken along line 10X-10X thereof, and illustrating a further embodiment of an interleaved pin fin pattern, in accordance with an aspect of the present invention.

FIGS. 10A-10D illustrate a variation on the immersion-cooled electronic subsystem of FIGS. 6A-6C. In this variation, the condenser fins 1000 and the fluid-boiling fins 1010 are each pin fins that are, by way of example only, cylindrical pin fins. Alternatively, the pin fins could have a variety of different pin fin cross-sectional configurations. For example, the condenser or fluid-boiling fins might have one or more of a rectangular, square, trapezoidal, triangular, parallelogram, part rectangular part curve, etc., transverse cross-sectional perimeter. The condenser and heat spreader pin fins can be arrayed in various layouts. FIGS. 10B-10D illustrate three such layout variations.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling apparatus comprising:
   a housing at least partially surrounding and forming a sealed compartment about an electronic subsystem comprising a plurality of electronic components to be cooled;
   a dielectric fluid disposed within the sealed compartment, wherein the electronic subsystem's plurality of electronic components to be cooled are immersed within the dielectric fluid;
   a heat spreader coupled to at least one electronic component of the plurality of electronic components to be cooled, the heat spreader comprising multiple fluid-boiling fins extending therefrom within the sealed compartment; and
   a liquid-cooled vapor condenser, the liquid-cooled vapor condenser comprising a plurality of thermally conductive condenser fins extending within the sealed compartment, wherein multiple thermally conductive condenser fins of the plurality of thermally conductive condenser fins are interleaved within the sealed compartment with the multiple fluid-boiling fins of the heat spreader coupled to at least one electronic component of the plurality of electronic components immersed within the dielectric fluid.

2. The cooling apparatus of claim 1, wherein the multiple thermally conductive condenser fins interleaved with the multiple fluid-boiling fins of the heat spreader comprise multiple condenser plate fins, and the multiple fluid-boiling fins comprise multiple fluid-boiling plate fins, each condenser plate fin being in opposing relation with at least one fluid-boiling plate fin of the multiple fluid-boiling plate fins of the heat spreader.

3. The cooling apparatus of claim 1, wherein the liquid-cooled vapor condenser further comprises a liquid-cooled base plate and a separate condenser fin base support coupled thereto, wherein the multiple thermally conductive condenser fins extend from the condenser fin base support.

4. The cooling apparatus of claim 3, wherein the multiple thermally conductive condenser fins extend in an at least partially converging manner from the condenser fin base support, and the multiple fluid-boiling fins extend in an at least partially diverging manner from a fluid-boiling base of the heat spreader.

5. The cooling apparatus of claim 3, wherein at least one thermally conductive condenser fin of the multiple thermally conductive condenser fins comprises a transverse cross-sectional perimeter which varies along at least a portion of a length thereof, and wherein at least one fluid-boiling fin comprises a transverse cross-sectional perimeter which varies along at least a portion of a length thereof, the transverse cross-sectional perimeter of the at least one thermally conductive condenser fin being larger closer to the condenser fin base support, and the transverse cross-sectional perimeter of the at least one fluid-boiling fin being larger closer to the fluid-boiling base of the heat spreader.

6. The cooling apparatus of claim 3, wherein the multiple thermally conductive condenser fins comprise a first set of thermally conductive condenser fins of the plurality of thermally conductive condenser fins, and wherein the plurality of thermally conductive condenser fins further comprise a second set of thermally conductive condenser fins, the second set of thermally conductive condenser fins comprising condenser fins of different length than condenser fins of the first set of thermally conductive condenser fins, and wherein the second set of thermally conductive condenser fins extend from the liquid-cooled base plate, and the first set of thermally conductive condenser fins extend from the condenser fin base support coupled to the liquid-cooled base plate.

7. The cooling apparatus of claim 1, wherein at least one thermally conductive condenser fin of the multiple thermally conductive condenser fins is longer than at least one other thermally conductive condenser fin of the multiple thermally conductive condenser fins interleaved with the multiple fluid-boiling fins of the heat spreader, and comprises at least one bend therein along its length, and wherein at least one fluid-boiling fin of the multiple fluid-boiling fins has a length longer than a length of at least one other fluid-boiling fin of the multiple fluid-boiling fins, and includes at least one bend therein, and wherein the at least one thermally conductive condenser fin is disposed in spaced, opposing relation to the at least one fluid-boiling fin.

8. The cooling apparatus of claim 1, wherein at least one thermally conductive condenser fin of the multiple thermally conductive condenser fins comprises a primary condenser fin and multiple secondary condenser fins extending therefrom towards at least one opposing fluid-boiling fin of the multiple fluid-boiling fins, and wherein the at least one opposing fluid-boiling fin comprises a primary fluid-boiling fin and multiple secondary fluid-boiling fins extending therefrom in a direction towards the at least one opposing thermally conductive condenser fin, wherein the multiple secondary condenser fins and the multiple secondary fluid-boiling fins of each opposing primary condenser fin and primary fluid-boiling fin are offset in an interleaved manner to facilitate localized cooling and condensing of dielectric fluid vapor between the opposing primary condenser fin and primary fluid-boiling fin.

9. The cooling apparatus of claim 8, wherein the at least one thermally conductive condenser fin comprises a heat pipe structure extending therein and extending at least partially within a condenser fin base support from which the at least one thermally conductive fin extends, and wherein the at least one fluid-boiling fin comprises a heat pipe structure disposed therein and extending at least partially within a fluid-boiling base of the heat spreader from which the at least one fluid-boiling fin extends.

10. The cooling apparatus of claim 1, wherein the multiple thermally conductive condenser fins comprise a first set of thermally conductive condenser fins of the plurality of thermally conductive condenser fins, and wherein the plurality of thermally conductive condenser fins further comprise a second set of thermally conductive condenser fins, the second set of thermally conductive condenser fins comprising condenser fins of different length than condenser fins of the first set of thermally conductive condenser fins, and wherein the cooling apparatus further comprises a filler material disposed within the sealed compartment, aligned over at least one other electronic component of the plurality of electronic components to be cooled and residing between the at least one other electronic component and multiple thermally conductive condenser fins of the second set of thermally conductive condenser fins, the filter material comprising multiple channels therein facilitating upwards flow of dielectric fluid vapor and downwards flow of dielectric fluid condensate therethrough.

11. The cooling apparatus of claim 1, wherein the electronic subsystem is oriented vertically, and at least one thermally conductive condenser fin of the multiple thermally conductive condenser fins angles downwards, and at least one fluid-boiling fin of the multiple fluid-boiling fins angles upwards, the at least one thermally conductive condenser fin and the at least one fluid-boiling fin being in spaced, opposing relation.

12. The cooling apparatus of claim 1, wherein the multiple thermally conductive condenser fins comprise multiple thermally conductive condenser pin fins and the multiple fluid-boiling fins of the heat spreader comprise multiple fluid-boiling pin fins.

13. A liquid-cooled electronics rack comprising:
an electronics rack comprising an electronic subsystem, the electronic subsystem comprising a plurality of electronic components; and
a cooling apparatus for immersion-cooling of the plurality of electronic components of the electronic subsystem, the cooling apparatus comprising:
a housing at least partially surrounding and forming a sealed compartment about the electronic subsystem, including the plurality of electronic components to be cooled;
a dielectric fluid disposed within the sealed compartment, wherein the electronic subsystem's plurality of electronic components to be cooled are immersed within the dielectric fluid;
a heat spreader coupled to at least one electronic component of the plurality of electronic components to be cooled, the heat spreader comprising multiple fluid-boiling fins extending therefrom within the sealed compartment; and
a liquid-cooled vapor condenser, the liquid-cooled vapor condenser comprising a plurality of thermally conductive condenser fins extending within the sealed compartment, wherein multiple thermally conductive condenser fins of the plurality of thermally conductive condenser fins are interleaved within the sealed compartment with the multiple fluid-boiling fins of the heat spreader coupled to the at least one electronic component of the plurality of electronic components immersed within the dielectric fluid.

14. The liquid-cooled electronics rack of claim 13, wherein the multiple thermally conductive condenser fins interleaved with the multiple fluid-boiling fins of the heat spreader comprise multiple condenser plate fins, and the multiple fluid-boiling fins comprise multiple fluid-boiling plate fins, each condenser plate fin being in opposing relation with at least one fluid-boiling plate fin of the multiple fluid-boiling plate fins of the heat spreader.

15. The liquid-cooled electronics rack of claim 13, wherein the liquid-cooled vapor condenser further comprises a liquid-cooled base plate and a separate condenser fin base support coupled thereto, wherein the multiple thermally conductive condenser fins extend from the condenser fin base support, and wherein the multiple thermally conductive condenser fins extend in an at least partially converging manner from the condenser fin base support, and the multiple fluid-boiling fins extend in an at least partially diverging manner from a fluid-boiling base of the heat spreader.

16. The liquid-cooled electronics rack of claim 13, wherein the liquid-cooled vapor condenser further comprises a liquid-cooled base plate and a separate condenser fin base support coupled thereto, wherein the multiple thermally conductive condenser fins extend from the condenser fin base support, and wherein at least one thermally conductive condenser fin comprises a transverse cross-sectional perimeter which varies along at least a portion of a length thereof, and wherein at least one fluid-boiling fin comprises a transverse cross-sectional perimeter which varies along at least a portion of a length thereof, the transverse cross-sectional perimeter of the at least one thermally conductive condenser fin being larger closer to the condenser fin base support, and the transverse cross-sectional perimeter of the at least one fluid boiling fin being larger closer to the fluid-boiling base of the heat spreader.

17. The liquid-cooled electronics rack of claim 13, wherein the multiple thermally conductive condenser fins comprise a first set of thermally conductive condenser fins of the plurality of thermally conductive condenser fins, and wherein the plurality of thermally conductive condenser fins further comprise a second set of thermally conductive condenser fins, the second set of thermally conductive condenser fins comprising condenser fins of different length than condenser fins of the first set of thermally conductive condenser fins, and wherein the liquid-cooled vapor condenser further comprises a liquid-cooled base plate and a separate condenser fins base support coupled thereto, wherein the second set of thermally conductive condenser fin extend from the liquid-cooled base plate, and the first set of thermally conductive condenser fins extend from the condenser fin base support coupled to the liquid-cooled base plate.

18. The liquid-cooled electronics rack of claim 13, wherein at least one thermally conductive condenser fin of the multiple thermally conductive condenser fins is longer than at least one other thermally conductive condenser fin of the multiple thermally conductive condenser fins, and comprises at least one bend therein along its length, and wherein at least one fluid-boiling fin of the multiple fluid-boiling fins has a length longer than a length of at least one other fluid-boiling fin of the multiple fluid-boiling fins, and includes at least one bend therein, and wherein the at least one thermally conductive condenser fin is disposed in spaced, opposing relation to the at least one fluid-boiling fin.

19. The liquid-cooled electronics rack of claim 13, wherein at least one thermally conductive condenser fin of the multiple thermally conductive condenser fins comprises a primary condenser fin and multiple secondary condenser fins extending therefrom towards at least one opposing fluid-boiling fin of multiple fluid-boiling fins, and wherein the at least one opposing fluid-boiling fin comprises a primary fluid-boiling fin and multiple secondary fluid-boiling fins extending therefrom in a direction towards the at least one opposing thermally conductive condenser fin, wherein the multiple secondary condenser fins and the multiple secondary fluid-boiling fins of each opposing primary condenser fin and primary fluid-boiling fin are offset in an interleaved manner to facilitate localized cooling and condensing of dielectric fluid vapor between the opposing primary condenser fin and primary fluid-boiling fin.

20. The liquid-cooled electronics rack of claim 19, wherein the at least one thermally conductive condenser fin comprises a heat pipe structure extending therein and extending at least partially within a condenser fin base support from which the at least one thermally conductive fin extends, and wherein the at least one fluid-boiling fin comprises a heat pipe structure disposed therein and extending at least partially within a fluid-boiling base of the heat spreader from which the at least one fluid-boiling fin extends.

21. The liquid-cooled electronics rack of claim 13, wherein the multiple thermally conductive condenser fins comprise a first set of thermally conductive condenser fins of the plurality of thermally conductive condenser fins, and wherein the plurality of thermally conductive condenser fins further comprise a second set of thermally conductive condenser fins, the second set of thermally conductive condenser fins comprising condenser fins of different length than condenser fins of the first set of thermally conductive condenser fins, and wherein the cooling apparatus further comprises a filler material disposed within the sealed compartment, aligned over at least one other electronic component of the plurality of electronic components to be cooled and residing between the at least one other electronic component and multiple thermally conductive condenser fins of the second set of thermally conductive condenser fins, the filter material comprising multiple channels therein facilitating upwards flow of dielectric fluid vapor and downwards flow of dielectric fluid condensate therethrough.

22. A method of facilitating cooling of an electronic subsystem, the method comprising:
providing a housing at least partially surrounding and forming a sealed compartment about the electronic subsystem, the electronic subsystem comprising a plurality of electronic components to be cooled, at least one electronic component of the plurality of electronic components having a heat spreader associated therewith, the heat spreader comprising multiple fluid-boiling fins extending within the sealed compartment;
immersing the electronic subsystem's plurality of electronic components within a dielectric fluid within the sealed compartment;
providing a liquid-cooled vapor condenser comprising a plurality of thermally conductive condenser fins extending within the sealed compartment, wherein providing the liquid-cooled vapor condenser includes interleaving multiple thermally conductive condenser fins of the plurality of thermally conductive condenser fins with the multiple fluid-boiling fins of the heat spreader coupled to the at least one electronic component of the plurality of electronic components immersed within the dielectric fluid.

23. The method of claim 22, wherein the multiple thermally conductive condenser fins extend in an at least partially converging manner from the liquid-cooled vapor condenser within the sealed compartment, and the multiple fluid-boiling fins extend in an at least partially diverging manner from a fluid-boiling base of the heat spreader.

24. The method of claim 22, wherein the multiple thermally conductive condenser fins comprise a first set of thermally conductive condenser fins of the plurality of thermally conductive condenser fins, and wherein the plurality of thermally conductive condenser fins further comprise a second set of thermally conductive condenser fins, the second set of thermally conductive condenser fins comprising condenser fins of different length than condenser fins of the first set of thermally conductive condenser fins, and wherein the second set of thermally conductive condenser fins extend from a liquid-cooled base plate of the liquid-cooled vapor condenser, and the first set of thermally conductive condenser fins extend from a condenser fin base support coupled to the liquid-cooled base plate.

25. The method of claim 22, wherein at least one thermally conductive condenser fin of the thermally conductive condenser fins comprises a primary condenser fin and multiple secondary condenser fins extending therefrom towards at least one opposing fluid-boiling fin of the multiple fluid-boiling fins, and wherein the at least one opposing fluid-boiling fin comprises a primary fluid-boiling fin and multiple secondary fluid-boiling fins extending therefrom in a direction towards the at least one opposing thermally conductive condenser fin, wherein the multiple secondary condenser fins and the multiple secondary fluid-boiling fins of each opposing primary condenser fin and primary fluid-boiling fin are offset in an interleaved manner to facilitate localized cooling and condensing of dielectric fluid vapor between the opposing primary condenser fin and primary fluid-boiling fin.

\* \* \* \* \*